(12) United States Patent
Lee et al.

(10) Patent No.: US 11,749,734 B2
(45) Date of Patent: Sep. 5, 2023

(54) INTEGRATED CIRCUIT DEVICES AND METHODS OF MANUFACTURING THE SAME

(71) Applicant: Samsung Electronics Co., Ltd., Suwon-si (KR)

(72) Inventors: Sanghyun Lee, Hwaseong-si (KR); Sungwoo Kang, Suwon-si (KR); Jongchul Park, Seoul (KR); Youngmook Oh, Hwaseong-si (KR); Jeongyun Lee, Yongin-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 18/087,854

(22) Filed: Dec. 23, 2022

(65) Prior Publication Data
US 2023/0128547 A1 Apr. 27, 2023

Related U.S. Application Data

(63) Continuation of application No. 17/329,361, filed on May 25, 2021, now Pat. No. 11,552,176.

(30) Foreign Application Priority Data

May 25, 2020 (KR) .................. 10-2020-0062645

(51) Int. Cl.
*H01L 29/78* (2006.01)
*H01L 29/417* (2006.01)
(Continued)

(52) U.S. Cl.
CPC .. *H01L 29/41791* (2013.01); *H01L 21/28518* (2013.01); *H01L 29/0847* (2013.01);
(Continued)

(58) Field of Classification Search
None
See application file for complete search history.

(56) References Cited

U.S. PATENT DOCUMENTS

| | | | |
|---|---|---|---|
| 9,236,452 B2 | 1/2016 | Lim et al. | |
| 9,425,310 B2 | 8/2016 | Yang | |

(Continued)

FOREIGN PATENT DOCUMENTS

| | | |
|---|---|---|
| CN | 107039507 A | 8/2017 |
| CN | 107123598 A | 9/2017 |
| CN | 110504170 A | 11/2019 |

*Primary Examiner* — Michael Lebentritt
(74) *Attorney, Agent, or Firm* — Myers Bigel, P.A.

(57) ABSTRACT

An integrated circuit device includes a fin-type active area that extends on a substrate in a first direction, a gate structure that extends on the substrate in a second direction and crosses the fin-type active area, source/drain areas arranged on first and second sides of the gate structure, and a contact structure electrically connected to the source/drain areas. The source/drain areas comprise a plurality of merged source/drain structures. Each source/drain area comprises a plurality of first points respectively located on an upper surface of the source/drain area at a center of each source/drain structure, and each source/drain area comprises at least one second point respectively located on the upper surface of the source/drain area where side surfaces of adjacent source/drain structures merge with one another. A bottom surface of the contact structure is non-uniform and corresponds to the first and second points.

20 Claims, 40 Drawing Sheets

(51) Int. Cl.
*H01L 29/08* (2006.01)
*H01L 29/66* (2006.01)
*H01L 21/285* (2006.01)
*H01L 29/45* (2006.01)

(52) U.S. Cl.
CPC ........ *H01L 29/45* (2013.01); *H01L 29/66545* (2013.01); *H01L 29/66795* (2013.01); *H01L 29/7851* (2013.01)

(56) References Cited

U.S. PATENT DOCUMENTS

| | | |
|---|---|---|
| 9,755,073 B1 | 9/2017 | Cheng et al. |
| 9,761,719 B2 | 9/2017 | Kim et al. |
| 10,084,093 B1 | 9/2018 | Mishra et al. |
| 10,283,502 B2 | 5/2019 | Yoon et al. |
| 10,355,000 B2 | 7/2019 | Choi et al. |
| 10,403,551 B2 | 9/2019 | Chu et al. |
| 11,552,176 B2 * | 1/2023 | Lee .................. H01L 21/28518 |
| 2015/0035023 A1 | 2/2015 | Kim et al. |
| 2016/0087026 A1 | 3/2016 | Kang et al. |
| 2016/0308004 A1 | 10/2016 | Lee et al. |
| 2016/0315045 A1 | 10/2016 | Baek et al. |
| 2016/0372567 A1 | 12/2016 | Tak et al. |
| 2017/0365555 A1 | 12/2017 | Choi et al. |
| 2019/0164966 A1 | 5/2019 | Wang et al. |
| 2019/0244963 A1 | 8/2019 | Kim et al. |
| 2019/0280115 A1 | 9/2019 | Li et al. |
| 2019/0341318 A1 | 11/2019 | Adusumilli et al. |
| 2022/0246761 A1 | 8/2022 | Yoon |

* cited by examiner

US 11,749,734 B2

INTEGRATED CIRCUIT DEVICES AND METHODS OF MANUFACTURING THE SAME

CROSS-REFERENCE TO RELATED APPLICATION

The present application is a continuation of and claims priority to U.S. patent application Ser. No. 17/329,361, filed May 25, 2021, which in turn claims the benefit of Korean Patent Application No. 10-2020-0062645, filed on May 25, 2020, in the Korean Intellectual Property Office, the disclosure of which is incorporated by reference herein in its entirety.

BACKGROUND

The present disclosure relates to integrated circuit devices and to methods of manufacturing the same, and more particularly, to integrated circuit devices including fin-type active areas and to methods of manufacturing the same.

Recently, as demand for increasingly portable electronic products has increased, there has been a corresponding increase in demand for increased integration of integrated circuit devices. As integrated circuit devices are downscaled, a short channel effect of a transistor may occur, which may result in deterioration in the reliability of the integrated circuit devices. In order to reduce the short channel effect, integrated circuit devices including fin-type active areas have been suggested.

SUMMARY

The present disclosure relates to integrated circuit devices that include a contact structure that has a reduced size in correspondence with a design rule that is reduced, and that provides a more reliable electrical connection. The present disclosure also relates to methods of manufacturing the same.

The objects of the present disclosure and the inventive concepts described herein are not limited to the above, and other objects that are not described above may be clearly understood by those skilled in the art.

According to some aspects of the inventive concepts, there is provided an integrated circuit device including a fin-type active area that extends on a substrate in a first direction, a gate structure that extends on the substrate in a second direction that intersects with the first direction, with the gate structure extending across the fin-type active area, source/drain areas arranged on first and second sides of the gate structure, and a contact structure electrically connected to the source/drain areas. The source/drain areas each comprise a plurality of merged source/drain structures. Each source/drain area comprises a plurality of first points respectively located on an upper surface of the source/drain area at a center of each source/drain structure, and each source/drain area comprises at least one second point respectively located on the upper surface of the source/drain area where side surfaces of adjacent source/drain structures merge with one another. A level of each first point is closer to the substrate than that each second point in a third direction perpendicular to an upper surface of the substrate. A bottom surface of the contact structure is non-uniform and corresponds to the first and second points.

According to some aspects of the inventive concepts, there is provided an integrated circuit device including a plurality of fin-type active areas that protrude from a substrate, a gate structure that crosses the plurality of fin-type active areas, source/drain areas comprising merged source/drain structures arranged on first and second sides of the gate structure, and a contact structure electrically connected to the merged source/drain structures. Upper surfaces of the merged source/drain structures comprise an undulation. Silicide layers and residual barriers are alternately arranged along the undulation.

According to some aspects of the inventive concepts, there is provided an integrated circuit device including a plurality of fin-type active areas that extend on a substrate in a first direction, a gate structure that extends on the substrate in a second direction that intersects with the first direction, wherein the gate structure crosses the plurality of fin-type active areas, source/drain areas arranged on first and second sides of the gate structure and on the plurality of fin-type active areas, an interlayer insulating layer that covers the source/drain areas, and a contact structure electrically connected to the source/drain areas through the interlayer insulating layer. The source/drain areas each comprise a plurality of source/drain structures merged together. An upper surface of each source/drain area comprises a first point corresponding a center of each of the source/drain structures and a second point corresponding to where adjacent source/drain structures are merged. A level of each first point is closer to the substrate than each second point in a third direction perpendicular to an upper surface of the substrate. A silicide layer is arranged between the contact structure and each of the source/drain structures at each first point. A residual barrier is arranged between the contact structure and each of the source/drain structures at each second point.

BRIEF DESCRIPTION OF THE DRAWINGS

Aspects of the present disclosure and embodiments of the inventive concepts will be more clearly understood from the following detailed description taken in conjunction with the accompanying drawings in which.

DETAILED DESCRIPTION OF THE EMBODIMENTS

Hereinafter, some embodiments of the inventive concepts will be described in detail with reference to the accompanying drawings.

Figure 1:
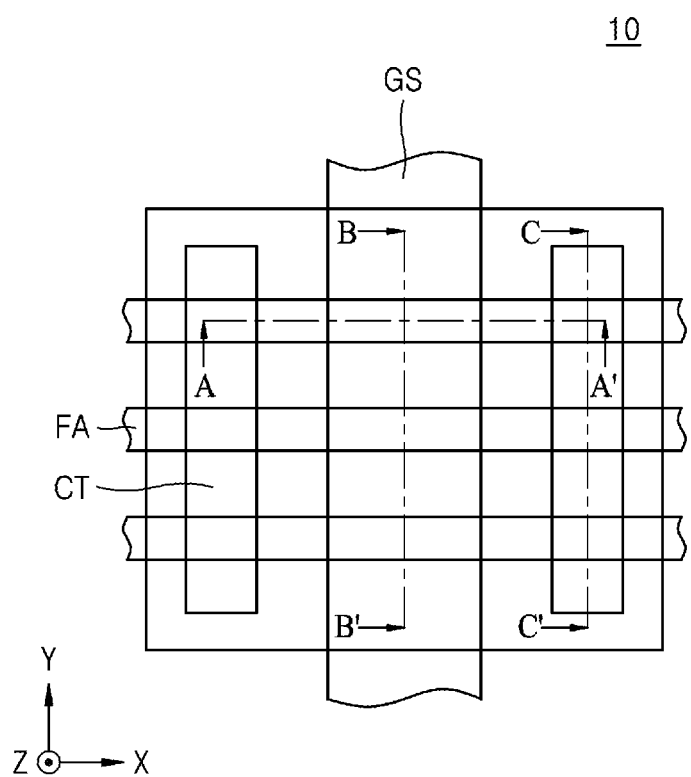
FIG. 1 is a layout diagram illustrating an integrated circuit device according to some embodiments of the inventive concepts.
Figure 2A:
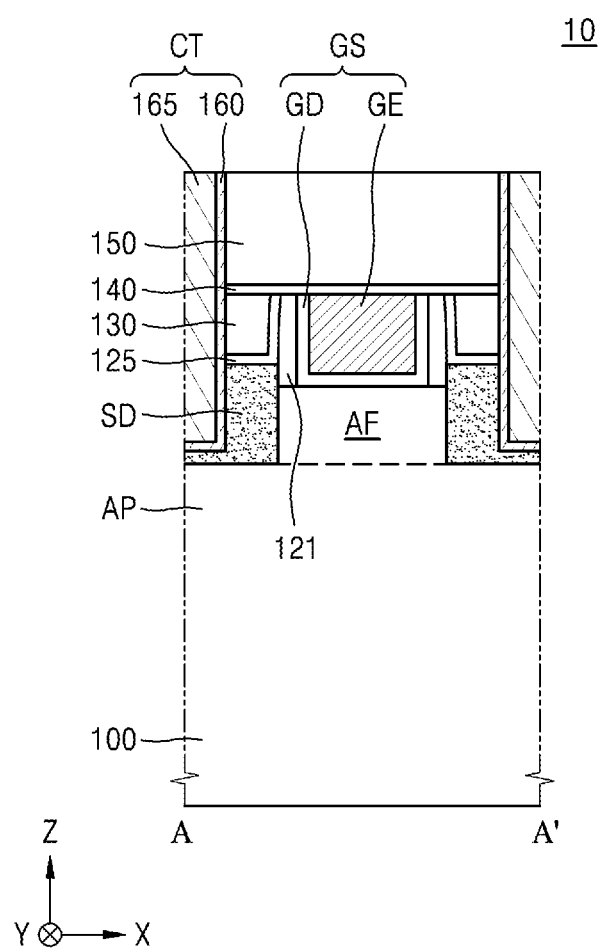
FIG. 2A is a cross-sectional view taken along the line A-A' of FIG. 1.
Figure 2B:
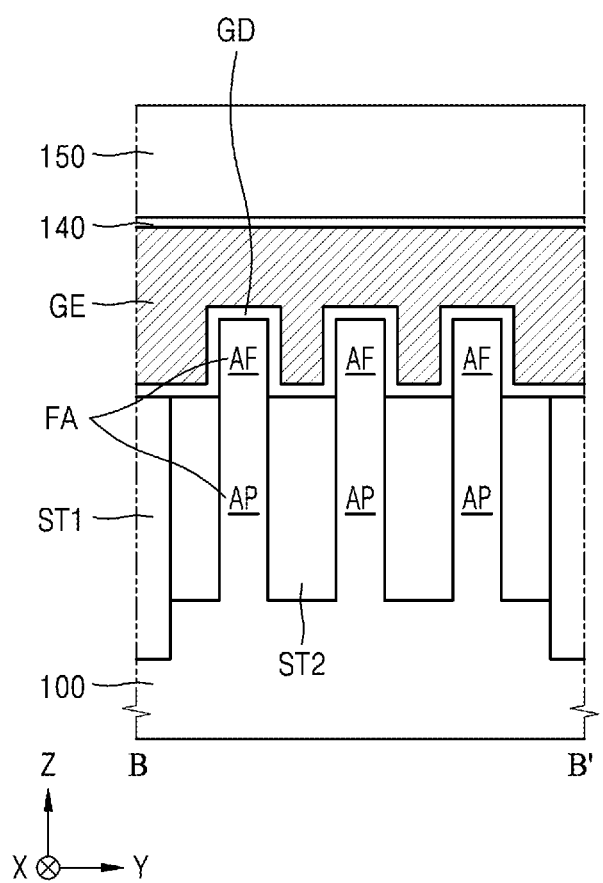
FIG. 2B is a cross-sectional view taken along the line B-B' of FIG. 1.
Figure 2C:
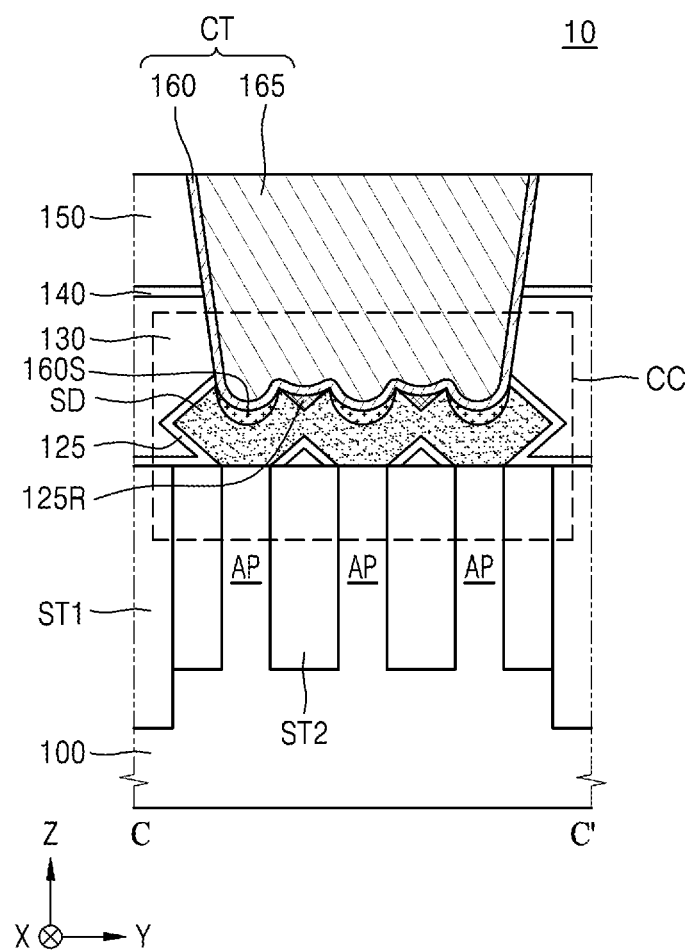
FIG. 2C is a cross-sectional view taken along the line C-C' of FIG. 1.

FIG. 1 is a layout diagram illustrating an integrated circuit device according to some embodiments of the inventive concepts, FIG. 2A is a cross-sectional view taken along the line A-A' of FIG. 1, FIG. 2B is a cross-sectional view taken along the line B-B' of FIG. 1, and FIG. 2C is a cross-sectional view taken along the line C-C' of FIG. 1.

Referring to FIGS. 1 and 2A to 2C, an integrated circuit device 10 according to some embodiments of the inventive concepts may include a fin-type active area FA, a gate structure GS, source/drain structures SD, and a contact structure CT.

A substrate 100 may be included in the integrated circuit device 10, and the substrate 100 may be a semiconductor substrate. In some embodiments, the substrate 100 may include a semiconductor such as silicon (Si) or germanium (Ge) or a compound semiconductor such as silicon germanium (SiGe), silicon calcium (SiC), gallium arsenic (GaAs), indium arsenic (InAs), or indium phosphide (InP). In some embodiments, the substrate 100 may have a silicon on insulator (SOI) structure.

In some embodiments, the substrate 100 may include a logic cell area in which logic transistors are provided. The logic transistors may be components of a logic circuit of the integrated circuit device 10. For example, the logic transistors may be components of a processor core or an input/output (I/O) terminal that is provided on the substrate 100.

In some embodiments, the substrate 100 may include a memory cell area in which a plurality of memory cells and/or memory cell transistors are provided. The memory cells and/or memory cell transistors may be configured to store data of the integrated circuit device 10. For example, memory cell transistors may be components of a plurality of static random access memory (SRAM) cells, each of which may include a number (e.g., six) transistors that are provided on the substrate 100.

In some embodiments, the substrate 100 may include an n-metal oxide semiconductor field effect transistor (MOSFET) area and a p-MOSFET area of the integrated circuit device 10. Here, the n-MOSFET area may be defined as an area in which at least one n-type transistor is arranged and the p-MOSFET area may be defined as an area in which at least one p-type transistor is arranged.

Active patterns AP may be arranged on the substrate 100. The active patterns AP may be in the form of lines or linear regions that extend in a first direction X and may be arranged to be apart from each other, or spaced apart from each other, in a second direction Y that intersects with the first direction X. In other words, a first active pattern AP and a second active pattern AP may extend in parallel in the first direction X and are spaced apart from each other by a first distance in the second direction Y. The active patterns AP may be arranged to be apart from each other at equal intervals.

First device isolation patterns ST1 may be arranged between the n-MOSFET area and the p-MOSFET area. Second device isolation patterns ST2 may be arranged around the active patterns AP. As best seen in FIG. 2B, lower surfaces of the first device isolation patterns ST1 may be at a level lower than that of lower surfaces of the second device isolation patterns ST2. In other words, the lower surfaces of the first device isolation patterns ST1 may be closer to a bottom surface of the substrate 100 than the lower surfaces of the second device isolation patterns ST2.

The second device isolation patterns ST2 may be arranged so that upper portions of the active patterns AP are exposed. Stated differently, upper surfaces of the active patterns AP may be farther from the bottom surface of the substrate 100 than upper surfaces of the second device isolation patterns ST2, and upper portions of the sidewalls of the active patterns AP may be free from contact with the second device isolation patterns ST2. The upper portions of the active patterns AP exposed by the second device isolation patterns ST2 may be defined as active fins AF. In some embodiments, and as best seen in FIG. 2B, the fin-type active area FA may include both the active patterns AP and the active fins AF. Upper surfaces of the first device isolation patterns ST1 may be at the same level as that of upper surfaces of the second device isolation patterns ST2. The present disclosure is not limited to the number and arrangement of the fin-type active areas FA, the first device isolation patterns ST1 and/or the second device isolation patterns ST2 illustrated in FIGS. 1 to 2C.

The gate structure GS may be arranged to extend in the second direction (Y) to intersect with the fin-type active area FA. The gate structure GS may include a gate dielectric pattern GD and a gate electrode GE. Although only one gate structure GS is illustrated in FIGS. 1 to 2C, the present disclosure is not limited thereto, and a plurality of gate structures GS may be present in the integrated circuit device 10.

The gate dielectric pattern GD may be formed to cover the fin-type active area FA. In some embodiments, the gate dielectric pattern GD may include silicon oxide or silicon oxynitride. In some embodiments, the gate dielectric pattern GD may include at least one of high dielectric layers. For example, the gate dielectric pattern GD may include at least one of hafnium oxide, hafnium silicate, zirconium oxide, and zirconium silicate. However, the inventive concepts are not limited thereto.

In some embodiments, the gate dielectric pattern GD may be arranged around the gate electrode GE. In some embodiments, as shown in FIG. 2A, the gate dielectric pattern GD may be on sidewalls and a bottom surface of the gate electrode GE, and the gate dielectric pattern GD may at least partially surround the gate electrode GE. The gate electrode GE may include a conductive material. The active fins AF arranged under the gate electrode GE may be defined as channel areas. The channel areas may be interposed between the source/drain structures SD.

The source/drain structures SD may be arranged on both sides of the gate structure GS. The source/drain structures SD are arranged on the active patterns AP. The source/drain structures SD may be formed by performing a selective epitaxial growth process. The source/drain structures SD may be epitaxial patterns that are grown by using upper surfaces of the active patterns AP thereunder as a seed. When the substrate 100 is a Si substrate, the source/drain structures SD may comprise, for example, Si or silicon carbide (SiC). The source/drain structures SD may cause and/or may be configured to cause tensile strain or compressive strain to the active fins AF.

In some embodiments, the source/drain structures SD may be formed so that adjacent side surfaces merge. That is, the source/drain structures SD may merge into a source/drain area. In the drawings, as best seen in FIG. 2C, it is illustrated that three source/drain structures SD merge to form a single source/drain area. However, the inventive concept is not limited thereto. In some embodiments, upper surfaces of the source/drain structures SD may be non-flat and/or uneven, and for example may be wave-shaped and/or comprise an undulation.

An etch stop layer 125 may extend to the outside of the source/drain structures SD while covering the upper surfaces of the first and second device isolation patterns ST1 and ST2. The etch stop layer 125 may comprise a material having etch selectivity for a first interlayer insulating layer 130. The etch stop layer 125 may include, for example, silicon nitride. In some embodiments, and as best seen in FIG. 2C, one or more residual barriers 125R isolated or separated from the etch stop layer 125 during manufacturing processes may be arranged on upper portions of the source/drain structures SD. In some embodiments, a plurality of residual barriers 125R may be present and may be spaced apart from each other. The residual barriers 125R may include silicon nitride or silicon oxynitride, which will be described in detail later.

The first interlayer insulating layer 130 may be arranged on the substrate 100. The first interlayer insulating layer 130 may cover the source/drain structures SD and the gate structure GS. The first interlayer insulating layer 130 may include at least one of silicon oxide and low dielectric layers.

A gate capping layer 140 and a second interlayer insulating layer 150 may be sequentially arranged on the first interlayer insulating layer 130. The gate capping layer 140 may cover the gate structure GS and the first interlayer insulating layer 130. The gate capping layer 140 may include, for example, silicon nitride. The second interlayer insulating layer 150 may include at least one of, for example, silicon oxide, silicon nitride, silicon oxynitride, and low dielectric layers.

The contact structure CT may be arranged to be electrically connected to the source/drain structures SD on both sides of the gate structure GS. The contact structure CT may be connected to the source/drain structures SD through the second interlayer insulating layer 150, the gate capping layer 140, the first interlayer insulating layer 130, and the etch stop layer 125. In some embodiments, the bottom surface of the contact structure CT that is in contact with the source/drain structures SD may have a non-flat shape, an uneven shape, and/or a non-uniform shape. For example, as best seen in FIG. 2C, a bottom surface of the contact structure CT may be wave-shaped. Described differently, the bottom surface of the contact structure CT may have an undulation.

The contact structure CT may include a barrier metal layer 160 and a contact metal layer 165. The barrier metal layer 160 may include at least one of, for example, titanium nitride and tantalum nitride. The contact metal layer 165 may include at least one of, for example, tungsten (W), titanium (Ti), and tantalum (Ta). In some embodiments, the contact structure CT may include a doped semiconductor material.

Silicide layers 160S may be between the source/drain structures SD and the contact structure CT. The silicide layers 160S may include at least one of, for example, titanium-silicide and tantalum-silicide. In addition, the silicide layers 160S may be arranged on the upper portions of the source/drain structures SD to be apart from each other. That is, the silicide layers 160S and the residual barriers 125R may be alternately arranged in the second direction (Y), which will be described in detail later.

As discussed above, demand for increasingly portable electronic products has increased, and there has been a corresponding demand for increased integration of integrated circuit devices. However, as integrated circuit devices are downscaled, a short channel effect of a transistor occurs, resulting in deterioration in the reliability of the integrated circuit devices. In order to reduce the short channel effect, the integrated circuit device 10 according to the inventive concepts includes the fin-type active area FA.

Additionally, in the integrated circuit device 10 according to the inventive concepts, the bottom surface of the contact structure CT may be wave-shaped, non-flat, non-uniform and/or uneven, in comparison with a case in which the bottom surface of the contact structure CT is flat and/or uniform. The non-flat, uneven, and/or undulating shape of the bottom surface of the contact structure CT and/or the upper surface of the source/drain structures SD may increase the contact area between the source/drain structures SD and the contact structure CT. Increasing the contact area between the source/drain structures SD and the contact structure CT may provide a more reliable electrical connection. Therefore, in the integrated circuit device 10, a more reliable electrical connection may be obtained and contact resistance may be reduced.

Figure 3:
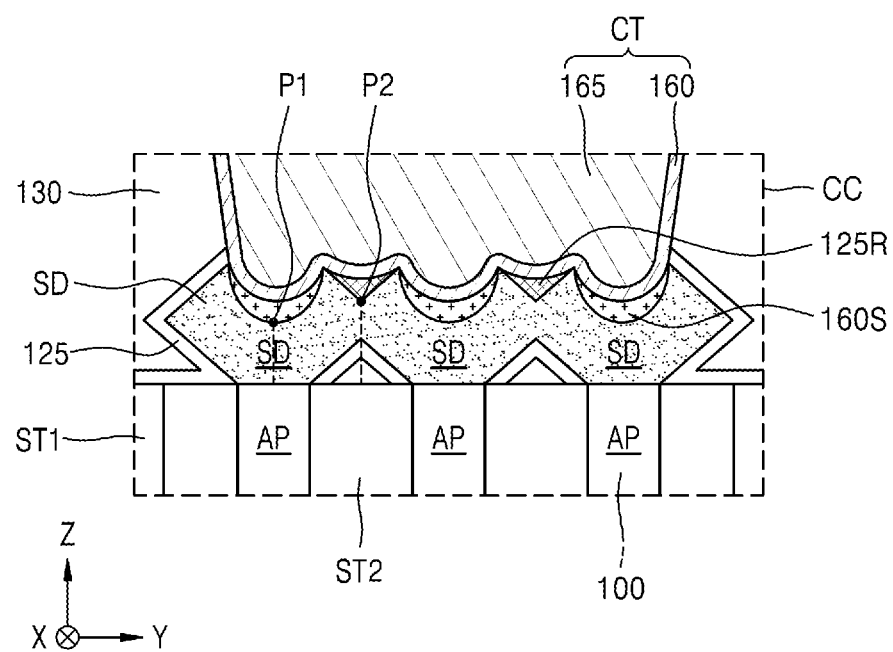
FIG. 3 is an enlarged view corresponding to the region CC of FIG. 2C.

FIG. 3 is an enlarged view corresponding to the region CC of FIG. 2C.

Referring to FIG. 3, the contact area between the source/drain structures SD and the contact structure CT is illustrated in more detail.

A source/drain area may result from merging the source/drain structures SD. Here, in the source/drain area, a point on the upper surface of the source/drain area at a center of each source/drain structure SD is defined as a first point P1, and a point on an upper surface of the source/drain area where a side surface of a source/drain structure SD merges with a side surface of a neighboring source/drain structure SD is defined as a second point P2.

In some embodiments, the number of source/drain structures SD may be the same as the number of first points P1, and the center of a fin-type active area FA may be aligned with each first point P1 in a third direction (Z) perpendicular to an upper surface of the substrate 100.

In some embodiments, in the third direction Z, a level of the first point P1 may be lower than that of the second point P2. In the second direction Y, the upper surfaces of the source/drain structures SD may be wave-shaped and to correspond to the first point P1 and the second point P2.

Phases of the upper surfaces of the source/drain structures SD may be the same as a phase of the bottom surface of the contact structure CT. In other words, a distance from a first trough in the upper surface of the source/drain area at a first one of the first points P1 to a second trough in the source/drain area at a second one of the first points P1 adjacent to the first one of the first points P1 may be equal to a distance between a first peak or crest in the bottom surface of the contact structure CT to a second peak or crest in the bottom surface of the contact structure CT. Therefore, in the second direction Y, the bottom surface of the contact structure CT may be wave-shaped and may correspond to the first point P1 and the second point P2.

At the first point P1, the silicide layer 160S may be arranged between the contact structure CT and the source/drain structure SD. At the second point P2, the residual barrier 125R may be arranged between the contact structure CT and the source/drain structure SD. That is, the silicide layers 160S and the residual barrier 125R are alternately arranged in the second direction Y.

A level of the lowermost surface of the silicide layer 160S may be lower than that of the lowermost surface of the residual barrier 125R. That is, the lowermost surface of the silicide layer 160S may be closer to the upper surface of the substrate 100 than the lowermost surface of the residual barrier 125R. In some embodiments, a length of the silicide layer 160S in the second direction Y may be greater than that of the residual barrier 125R in the second direction Y.

The contact structure CT may include a barrier metal layer 160 that extends onto the silicide layer 160S and the residual barrier 125R, and the contact structure CT may include the contact metal layer 165 arranged on the barrier metal layer 160. In some embodiments, the etch stop layer 125 may be arranged along the outside of the source/drain structures SD at portions thereof not in contact the contact structure CT, and the etch stop layer 125 may contact the barrier metal layer 160.

Figure 4:
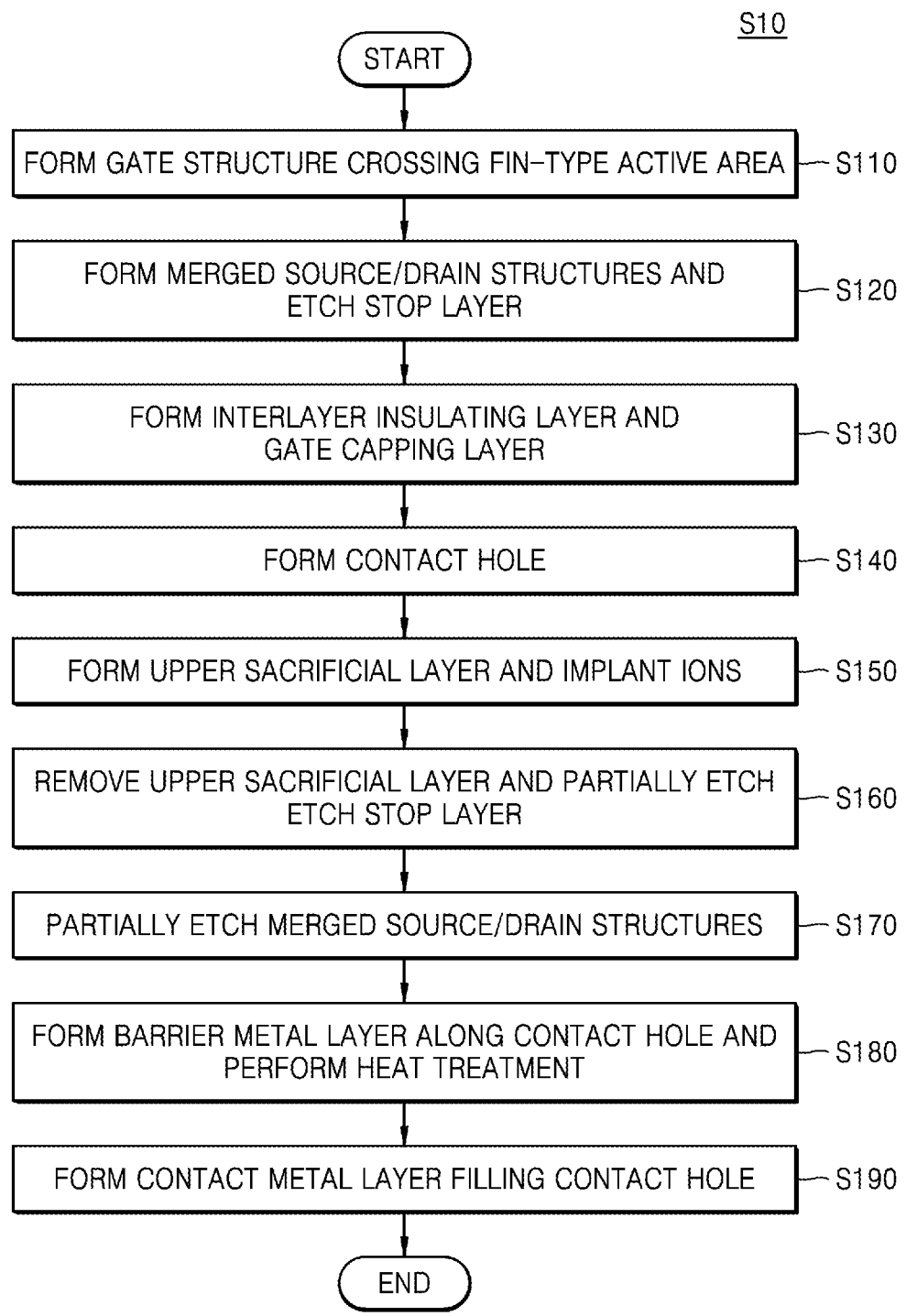
FIG. 4 is a block diagram illustrating processes of a method of manufacturing an integrated circuit device in the order, according to some embodiments of the inventive concepts.

FIG. 4 is a block diagram illustrating processes of a method S10 of manufacturing an integrated circuit device, according to some embodiments of the inventive concepts.

The method S10 of manufacturing an integrated circuit device, according to an exemplary embodiment of the inventive concept, may include the following operations. Although in some embodiments the operations of the method S10 may be performed sequentially in the order shown in FIG. 4, in some embodiments a specific process order may be different from the described order. For example, in some embodiments, two separately described processes may be simultaneously performed and may be performed in the order reverse to the described order.

Referring to FIG. 4, a method S10 of manufacturing the integrated circuit device may include a first operation S110 of forming a gate structure crossing the fin-type active area, a second operation S120 of forming the merged source/drain structure and the etch stop layer, a third operation S130 of forming the interlayer insulating layer and the gate capping layer, a fourth operation S140 of forming a contact hole, a fifth operation S150 of forming an upper sacrificial layer and implanting ions, a sixth operation S160 of removing the upper sacrificial layer and partially etching the etch stop layer, a seventh operation S170 of partially etching the merged source/drain structure, an eighth operation S180 of forming the barrier metal layer along the contact hole and performing heat treatment, and a ninth operation S190 of forming the contact metal layer filling the contact hole.

Technical features of the first to ninth operations S110 to S190 will be described in detail with reference to FIGS. 5A to 15C.

FIGS. 5A, 6A, 7A, 8A, 9A, 10A, 11A, 12A, 13A, 14A, and 15A are cross-sectional views taken along the line A-A' of FIG. 1 and illustrating processes of a method of manufacturing an integrated circuit device in the order according to an exemplary embodiment of the inventive concept, FIGS. 5B, 6B, 7B, 8B, 9B, 10B, 11B, 12B, 13B, 14B, and 15B are cross-sectional views taken along the line B-B' of FIG. 1, and FIGS. 5C, 6C, 7C, 8C, 9C, 10C, 11C, 12C, 13C, 14C, and 15C are cross-sectional views taken along the line C-C' of FIG. 1.

Figure 5A:
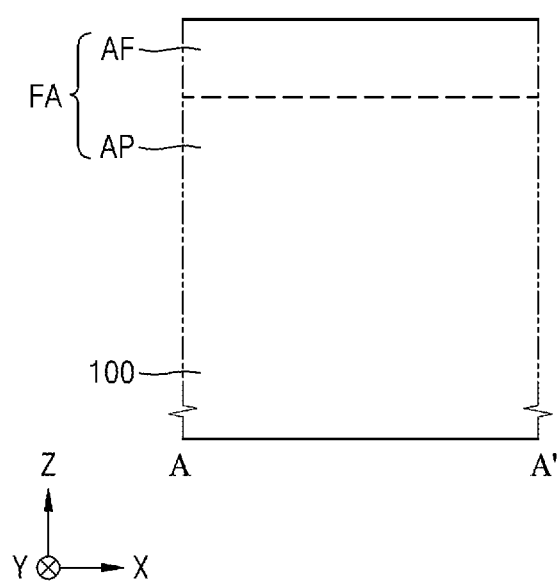
FIGS. 5A, 6A, 7A, 8A, 9A, 10A, 11A, 12A, 13A, 14A, and 15A are cross-sectional views taken along the line A-A' of FIG. 1 and illustrating processes of a method of manufacturing an integrated circuit device in the order according to some embodiments of the inventive concepts.
Figure 5B:
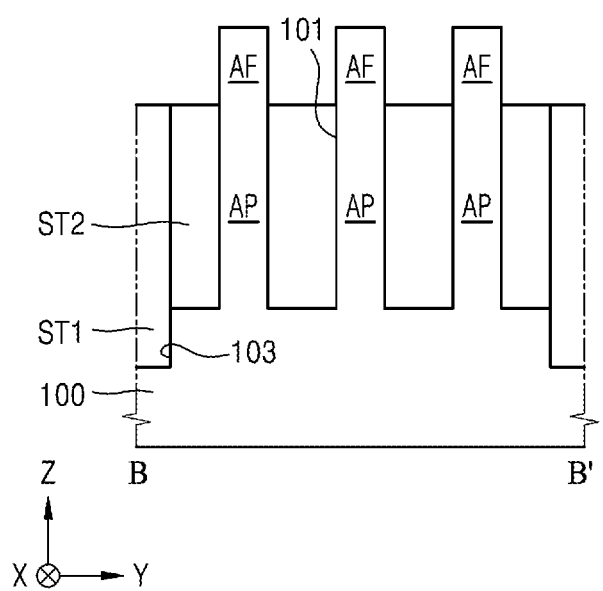
FIGS. 5B, 6B, 7B, 8B, 9B, 10B, 11B, 12B, 13B, 14B, and 15B are cross-sectional views taken along the line B-B' of FIG. 1.
Figure 5C:
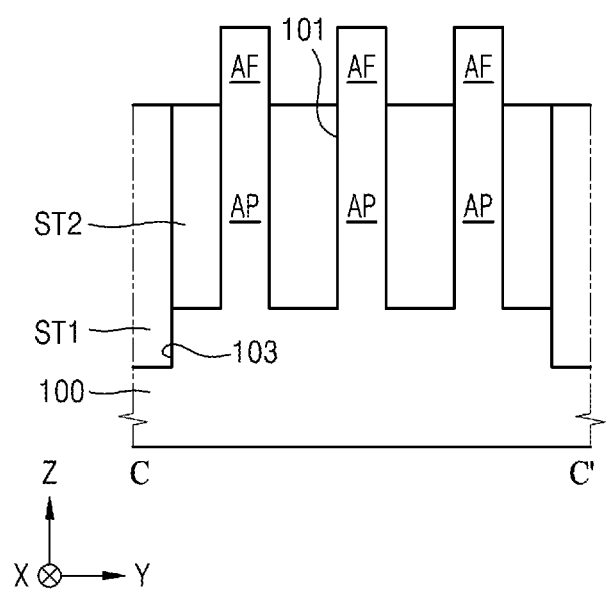
FIGS. 5C, 6C, 7C, 8C, 9C, 10C, 11C, 12C, 13C, 14C, and 15C are cross-sectional views taken along the line C-C' of FIG. 1.

Referring to FIGS. 5A, 5B, and 5C, the fin-type active area FA may be provided on the substrate 100.

The substrate 100 may be a semiconductor substrate. In some embodiments, the substrate 100 may include the logic cell area in which the logic transistors that are components of a logic circuit of the integrated circuit device 10 are arranged. In some embodiments, the substrate 100 may include the memory cell area in which the plurality of memory cells for storing the data of the integrated circuit device 10 are arranged. The substrate 100 may include a n-MOSFET area and/or a p-MOSFET area.

Shallow trenches 101 defining the active patterns AP may be formed by patterning the substrate 100. The active patterns AP may be in the form of lines or linear regions that extend in the first direction X and may be arranged to be apart from each other (e.g., spaced apart from each other) in the second direction Y that intersects with the first direction X. The active patterns AP may be formed to be apart from each other at equal intervals.

Unnecessary active patterns AP may be removed between the n-MOSFET area and the p-MOSFET area. Unnecessary active patterns AP may be removed so that deep trenches 103 may be formed between the n-MOSFET area and the p-MOSFET area. Lower surfaces of the deep trenches 103 may be at a level lower than that of lower surfaces of the shallow trenches 101.

The first device isolation patterns ST1 may be formed to fill the deep trenches 103. In addition, the second device isolation patterns ST2 may be formed to fill the shallow trenches 101. The second device isolation patterns ST2 may be formed so that the upper portions of the active patterns AP are exposed. The upper portions of the active patterns AP exposed by the second device isolation patterns ST2 may be defined as the active fins AF. The fin-type active area FA may include both the active patterns AP and the active fins AF. The upper surfaces of the first device isolation patterns ST1 may be at the same level as that of the upper surfaces of the second device isolation patterns ST2.

Figure 6A:
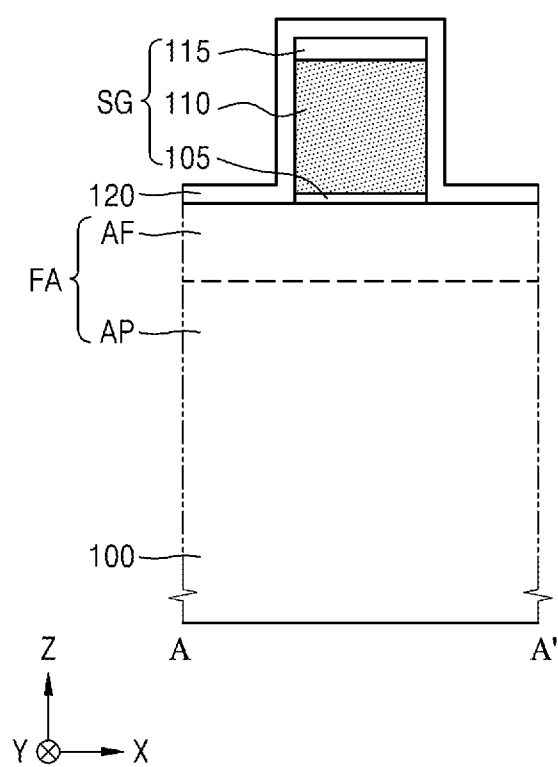
Figure 6B:
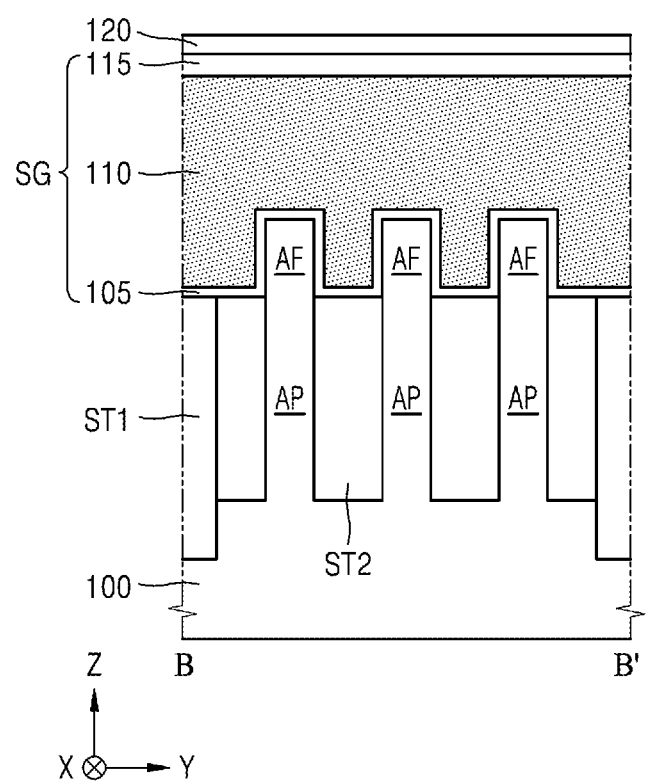
Figure 6C:
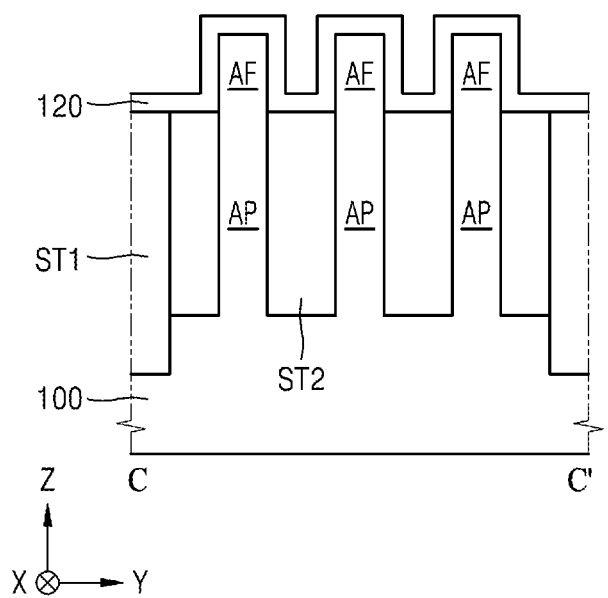

Referring to FIGS. 6A, 6B, and 6C, a sacrificial gate structure SG including a sacrificial dielectric layer 105, a sacrificial gate 110, and a sacrificial mask 115 that are sequentially laminated may be formed on the substrate 100.

The sacrificial gate structure SG may cross the active fins AF. That is, the sacrificial dielectric layer 105 and the sacrificial gate 110 may extend onto the upper surfaces of the first and second device isolation patterns ST1 and ST2 while covering upper surfaces and side walls of the active fins AF. The sacrificial mask 115 may be arranged on an upper surface of the sacrificial gate 110 and may extend along the upper surface of the sacrificial gate 110.

The sacrificial dielectric layer 105 may include, for example, silicon oxide. The sacrificial gate 110 may include a material having etch selectivity for the sacrificial dielectric layer 105. The sacrificial gate 110 may include, for example, polysilicon. The sacrificial gate 110 may be formed by a chemical vapor deposition (CVD) process, a physical vapor deposition (PVD) process, or an atomic layer deposition (ALD) process. The sacrificial mask 115 may include, for example, silicon nitride or silicon oxynitride.

A spacer layer 120 that covers and/or conforms to the sacrificial gate structure SG may be formed. The spacer layer 120 may include, for example, silicon nitride. Alternatively, the spacer layer 120 may include low-k nitride such as SiCN or SiOCN. The spacer layer 120 may be formed by a CVD process or an ALD process.

Figure 7A:
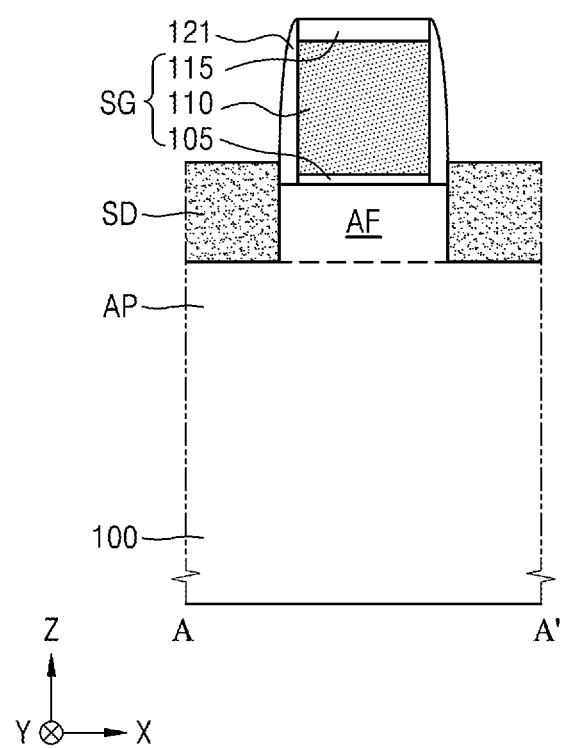
Figure 7B:
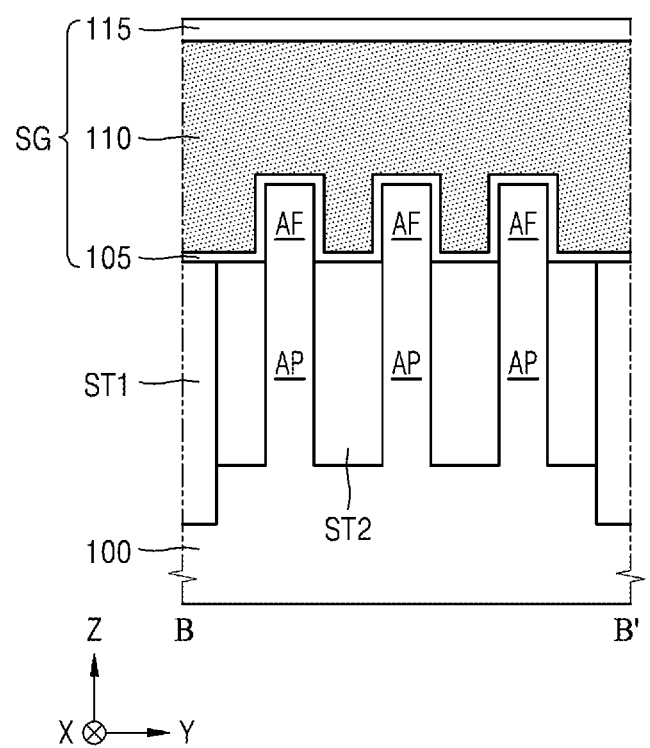
Figure 7C:
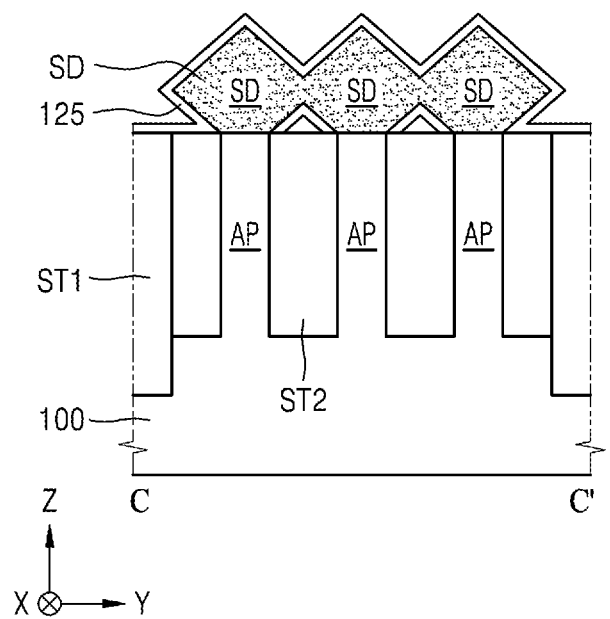

Referring to FIGS. 7A, 7B, and 7C, the upper portions of the active patterns AP on both sides of the sacrificial gate structure SG may be removed.

A process of removing the upper portions of the active patterns AP may include an etching process in which a mask pattern is formed on the substrate 100 and is used as an etching mask. The etching process may include dry or wet etching. The upper portions of the active patterns AP may be removed, the spacer layer 120 may be etched so that gate spacers 121 may be formed on side walls of the sacrificial gate structure SG. In some embodiments, the gate spacers 121 may be formed while the upper portions of the active patterns are removed, for example in a single process.

Then, the source/drain structures SD may be arranged on both sides of the sacrificial gate structure SG. The source/drain structures SD are arranged on the active patterns AP. The source/drain structures SD may be formed by performing a selective epitaxial growth process. The source/drain structures SD may be the epitaxial patterns grown by using the upper surfaces of the active patterns AP thereunder as the seed. When the substrate 100 is a Si substrate, the source/drain structures SD may be formed of, for example, Si or SiC.

In some embodiments, the source/drain structures SD may be formed so that adjacent side surfaces of the source/drain structures SD merge. That is, the source/drain structures SD may merge to form a source/drain area. In the drawings, it is illustrated that three source/drain structures SD merge to form a source/drain area. However, the inventive concepts are not limited thereto. In addition, the upper surfaces of the source/drain structures SD may be V-shaped such that the centers of the upper surfaces of the source/drain structures SD are concave.

Figure 8A:
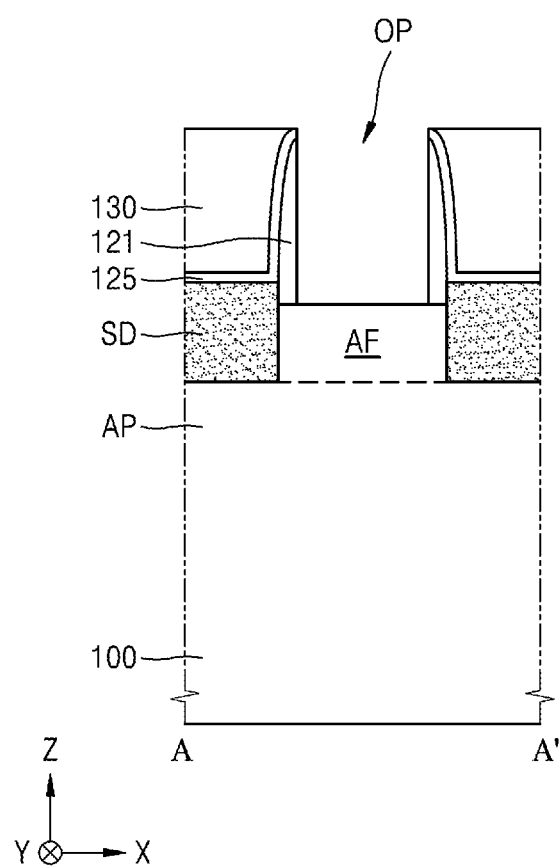
Figure 8B:
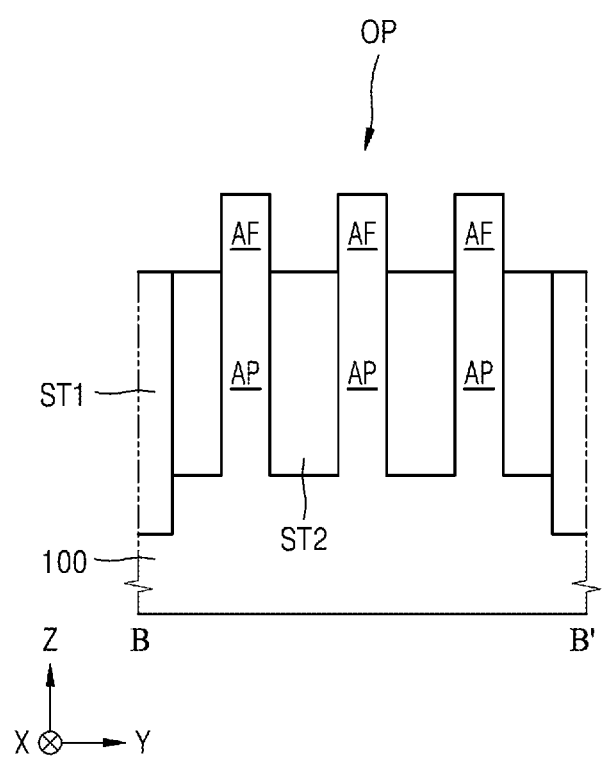
Figure 8C:
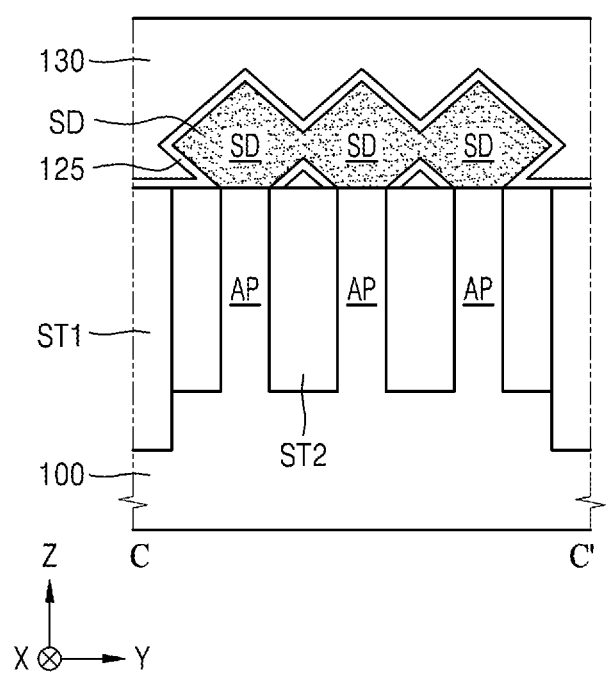

Referring to FIGS. 8A, 8B, and 8C, the etch stop layer 125 may be conformally formed on the substrate 100 and the source/drain structures SD.

The etch stop layer 125 may extend onto the source/drain structures SD while covering the upper surfaces of the first and second device isolation patterns ST1 and ST2. The etch stop layer 125 may be formed of a material having etch selectivity for the first interlayer insulating layer 130. For example, the etch stop layer 125 may include silicon nitride or silicon oxynitride. The etch stop layer 125 may be formed by a CVD process or an ALD process.

The first interlayer insulating layer 130 may be formed on the substrate 100 on which the etch stop layer 125 is formed. The first interlayer insulating layer 130 may be formed to cover the source/drain structures SD and the sacrificial gate structure SG (refer to FIG. 7A).

The first interlayer insulating layer 130 may include at least one of silicon oxide and low dielectric layers. A process of planarizing the first interlayer insulating layer 130 may be performed so that an upper surface of the sacrificial gate structure SG (refer to FIG. 7A) is exposed. The planarizing process may be performed by an etch back process or a chemical mechanical polishing (CMP) process.

By removing the exposed sacrificial gate structure SG (refer to FIG. 7A), open areas OP exposing the active fins AF between the gate spacers 121 may be formed. The open areas OP may be formed by performing an etching process of selectively removing the sacrificial gate structure SG (refer to FIG. 7A).

Figure 9A:
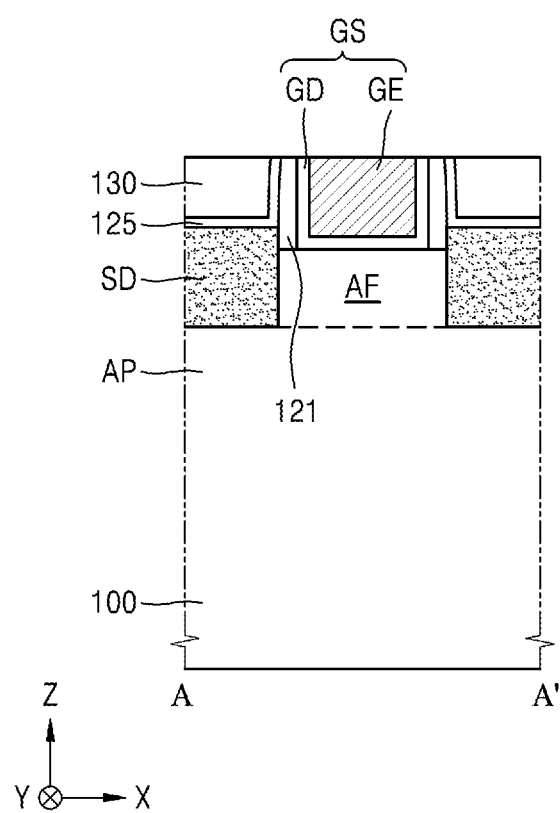
Figure 9B:
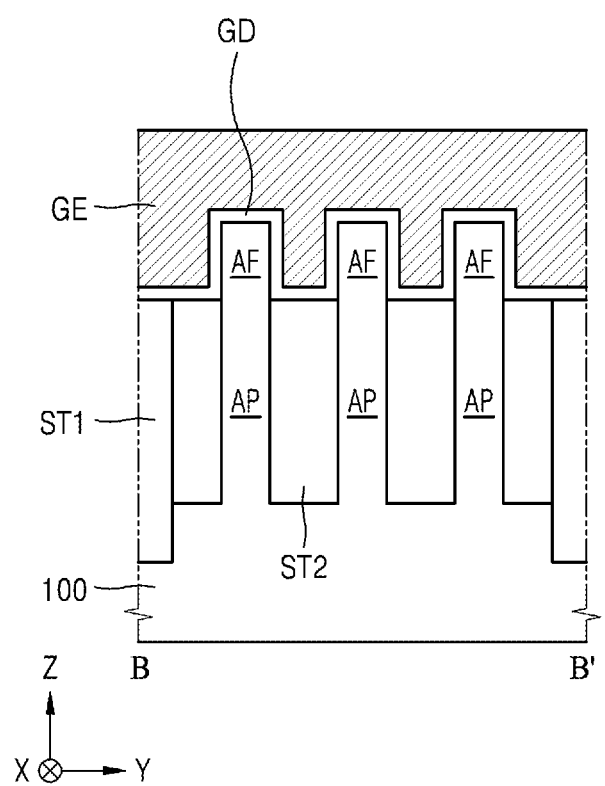
Figure 9C:
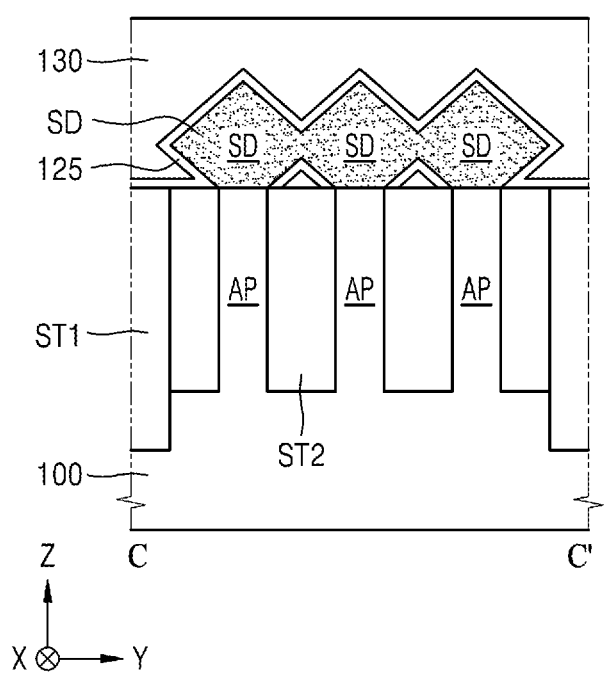

Referring to FIGS. 9A, 9B, and 9C, the gate dielectric pattern GD and the gate electrode GE that fill open areas OP (refer to FIG. 8A) may be formed.

Specifically, a gate dielectric layer may be formed on the substrate 100 including the open areas OP (refer to FIG. 8A) to fill parts of the open areas OP (refer to FIG. 8A). The gate dielectric layer may be formed to cover the active fins AF. In some embodiments, the gate dielectric layer may include silicon oxide or silicon oxynitride. In some embodiments, the gate dielectric layer may include at least one of high dielectric layers. For example, the gate dielectric layer may include at least one of hafnium oxide, hafnium silicate, zirconium oxide, and zirconium silicate. However, the inventive concepts are not limited thereto.

The gate dielectric layer may be formed by performing, for example, a CVD process or an ALD process. A gate layer may be formed on the gate dielectric layer to fill all the open areas OP (refer to FIG. 8A). The gate layer may include at least one of conductive metal nitride and metal.

By planarizing the gate dielectric layer and the gate layer that are sequentially laminated, the gate dielectric pattern GD and the gate electrode GE may be formed in the open areas OP (refer to FIG. 8A). The gate dielectric pattern GD may extend along a bottom surface of the gate electrode GE. In addition, the gate dielectric pattern GD may be arranged on side walls of the gate electrode GE and may be between the gate electrode GE and the gate spacers 121.

By the planarizing process, upper surfaces of the first interlayer insulating layer 130 and the gate spacers 121 may be exposed. The planarized upper surface of the first interlayer insulating layer 130 may be at the same level as that of an upper surface of the gate electrode GE.

The active fins AF arranged under the gate electrode GE may be channel areas. The channel areas may be interposed among the source/drain structures SD. The gate structure GS may include both the gate dielectric pattern GD and the gate electrode GE.

Figure 10A:
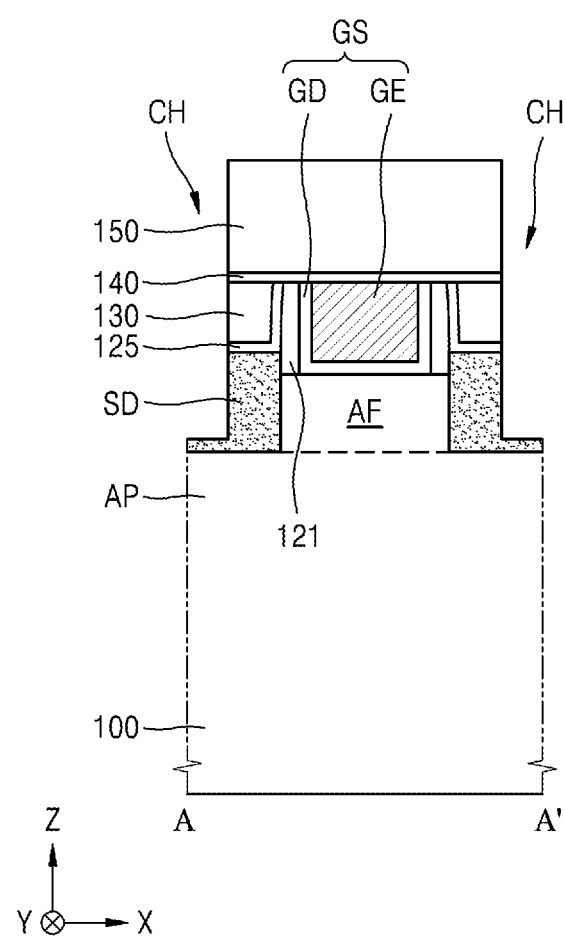
Figure 10B:
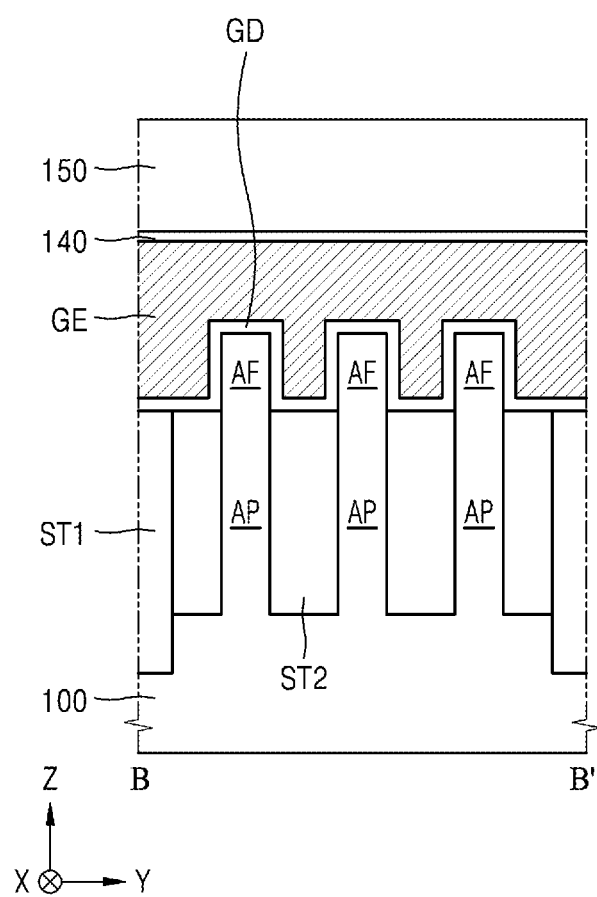
Figure 10C:
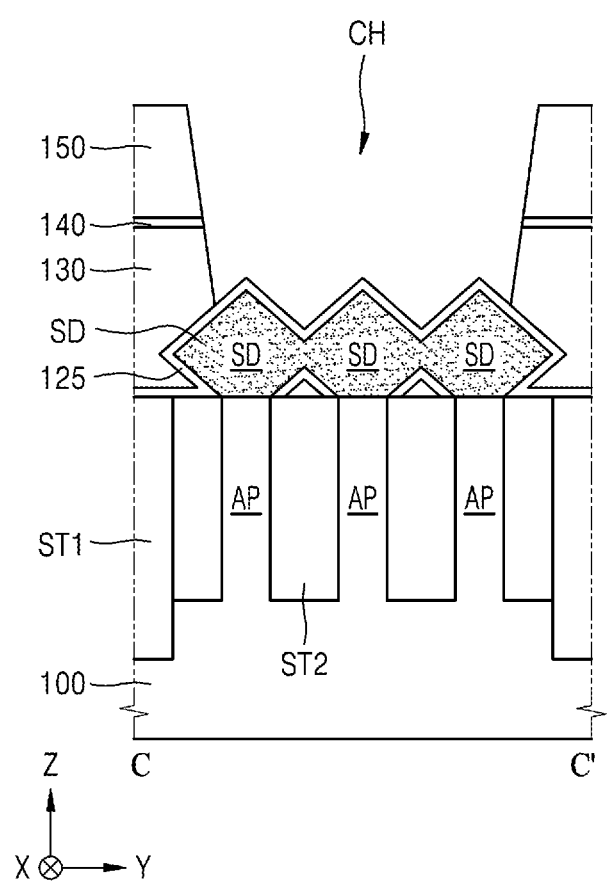

Referring to FIGS. 10A, 10B, and 10C, the gate capping layer 140 and the second interlayer insulating layer 150 may be sequentially formed on the gate structure GS and the first interlayer insulating layer 130.

The gate capping layer 140 may cover the gate structure GS and the first interlayer insulating layer 130. The gate capping layer 140 may include, for example, silicon nitride. The second interlayer insulating layer 150 may include at least one of silicon oxide, silicon nitride, silicon oxynitride, and low dielectric layers. Each of the gate capping layer 140 and the second interlayer insulating layer 150 may be formed by, for example, a CVD process.

Then, through the second interlayer insulating layer 150, the gate capping layer 140, and the first interlayer insulating layer 130, a contact hole CH that exposes an upper surface of the etch stop layer 125 may be formed. The contact hole CH may expose the etch stop layer 125 covering the upper surfaces of the source/drain structures SD.

After forming a mask pattern (not shown) on the second interlayer insulating layer 150, the contact hole CH may be formed by an anisotropic etching process using the mask pattern as an etching mask. By using etch selectivity, the etching process of the contact hole CH may be performed so that etching is stopped by the etch stop layer 125.

Figure 11A:
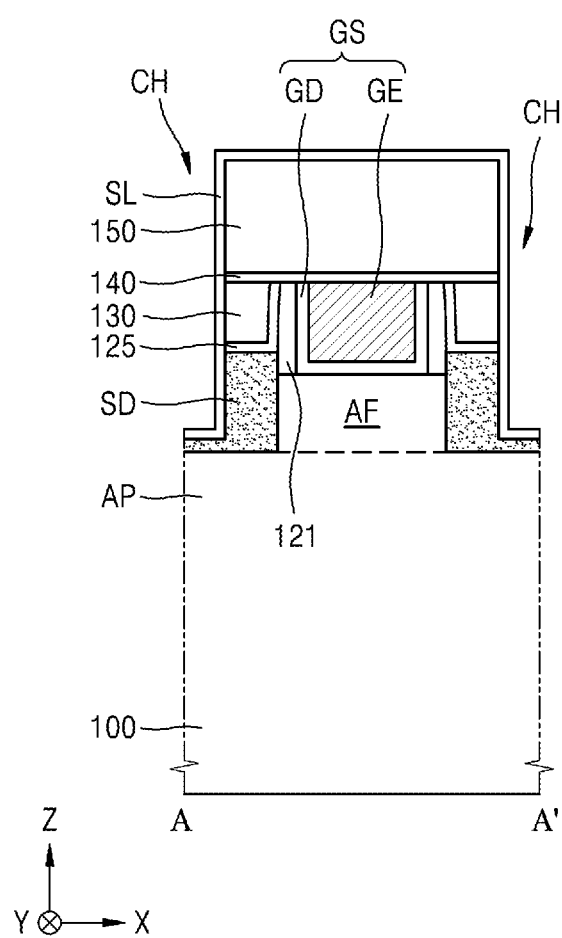
Figure 11B:
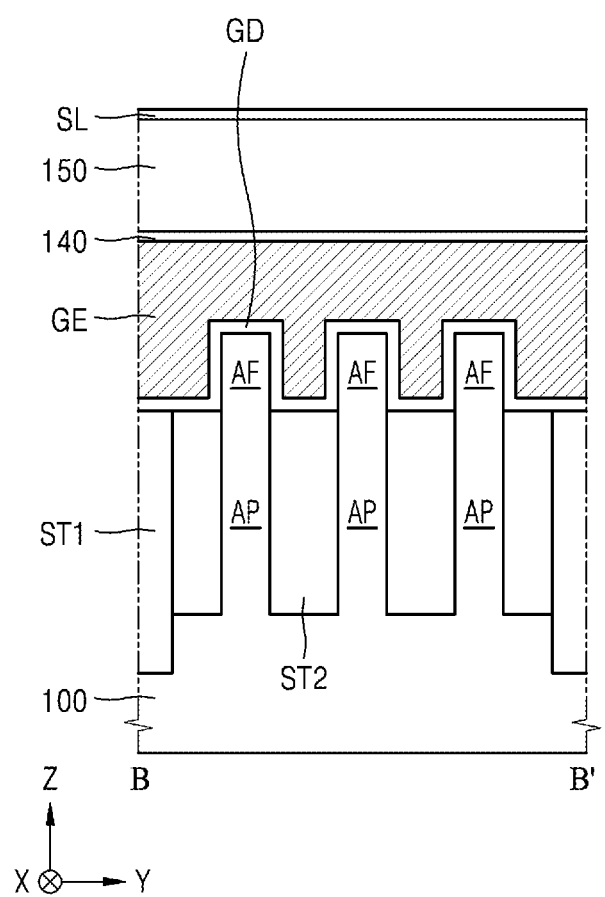
Figure 11C:
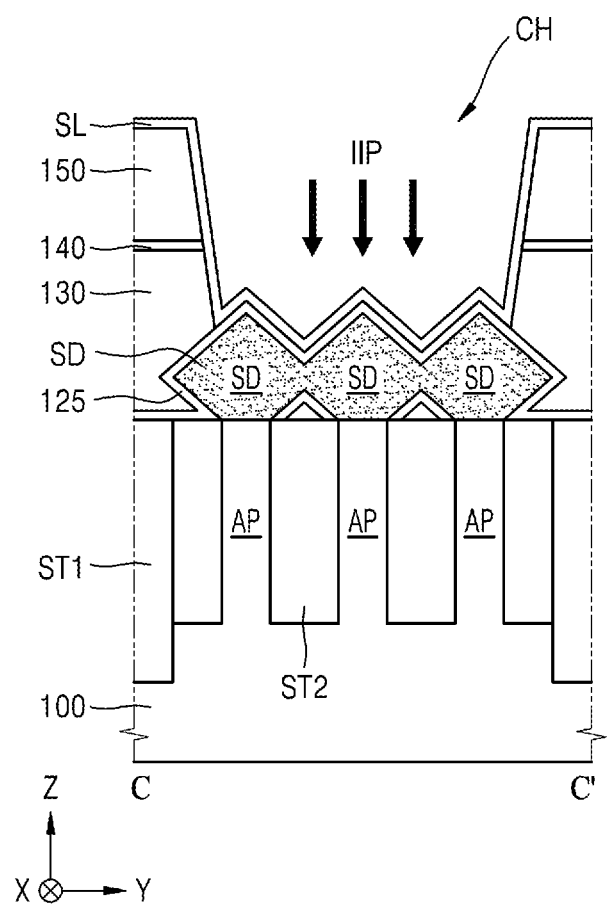

Referring to FIGS. 11A, 11B, and 11C, an upper sacrificial layer SL may be conformally formed along the contact hole CH.

The upper sacrificial layer SL may extend along the upper surface of the etch stop layer 125, a side wall of the contact hole CH, and an upper surface of the second interlayer insulating layer 150. The upper sacrificial layer SL may include, for example, silicon nitride.

Then, an ion implanting process IIP may be performed on the substrate 100. An ion source used for the ion implanting process IIP may be, for example, gallium (Ga). In this case, through the ion implanting process IIP, the upper portions of the source/drain structures SD may be doped with Ga.

In some embodiments, in SiGe forming the source/drain structures SD, Ga may have high solubility. Therefore, the source/drain structures SD may have high Ga density.

An annealing process may be performed on the source/drain structures SD doped with Ga. Through the annealing process, doped Ga may be diffused into the source/drain structures SD. On the other hand, the upper sacrificial layer SL may prevent the source/drain structures SD from being atypicalized by the annealing process and may prevent doped Ga from being lost.

Figure 12A:
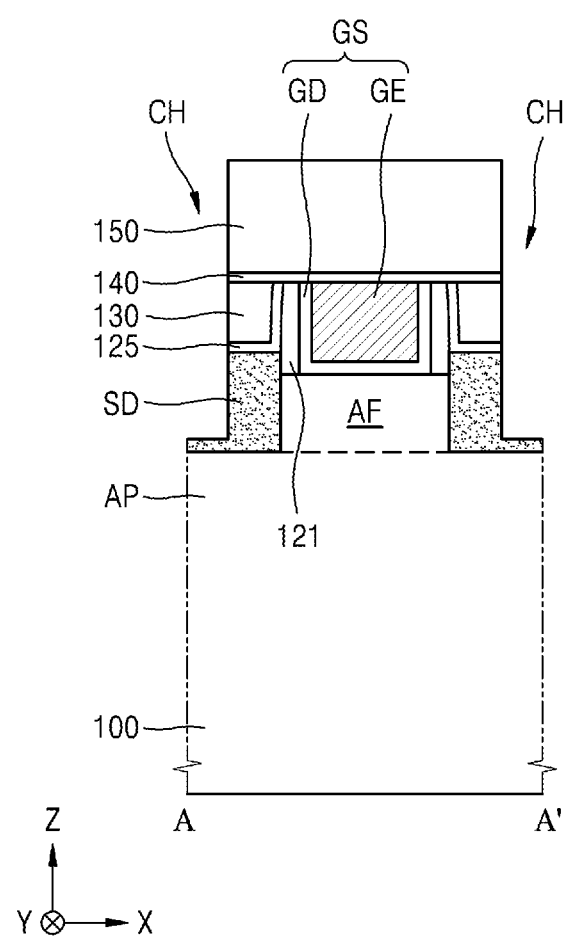
Figure 12B:
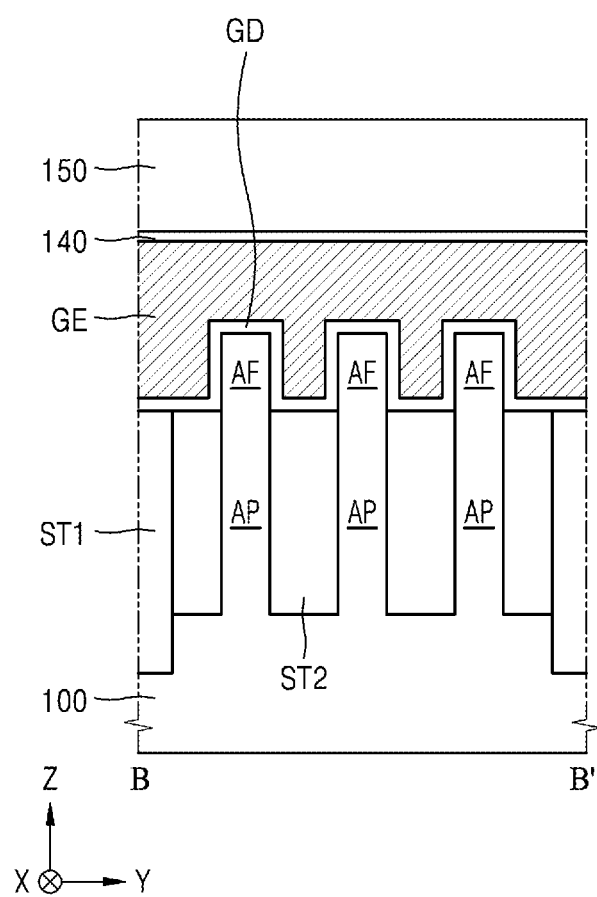
Figure 12C:
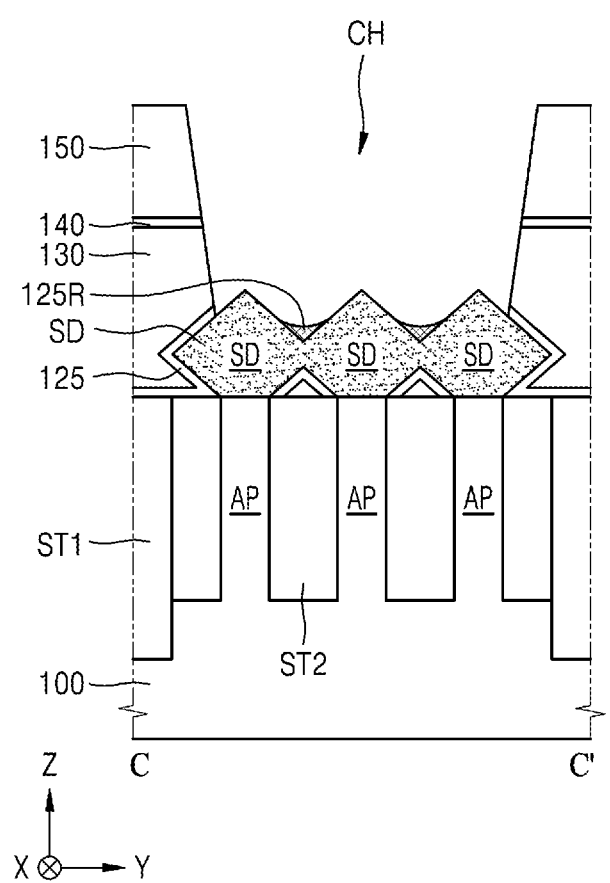

Referring to FIGS. 12A, 12B, and 12C, the upper sacrificial layer SL (refer to FIG. 11C) may be completely removed.

While the upper sacrificial layer SL (refer to FIG. 11C) is etched to be removed, a part of the etch stop layer 125 may be excessively etched. That is, the upper sacrificial layer SL (refer to FIG. 11C) on the etch stop layer 125 is completely removed and an exposed portion of the etch stop layer 125 may be subsequently etched.

Some portions of the etch stop layer 125 are not etched and the residual barriers 125R that are parts of the etch stop layer 125 may remain on parts of the upper surfaces of the source/drain structures SD. The residual barriers 125R may be positioned in the concave V-shaped portions of the upper surfaces of the source/drain structures SD.

During the etching process, oxygen permeates into the residual barriers 125R so that the residual barriers 125R may include a material different from that of the etch stop layer 125. That is, the etch stop layer 125 may include silicon nitride and the residual barriers 125R may include silicon oxynitride.

Figure 13A:
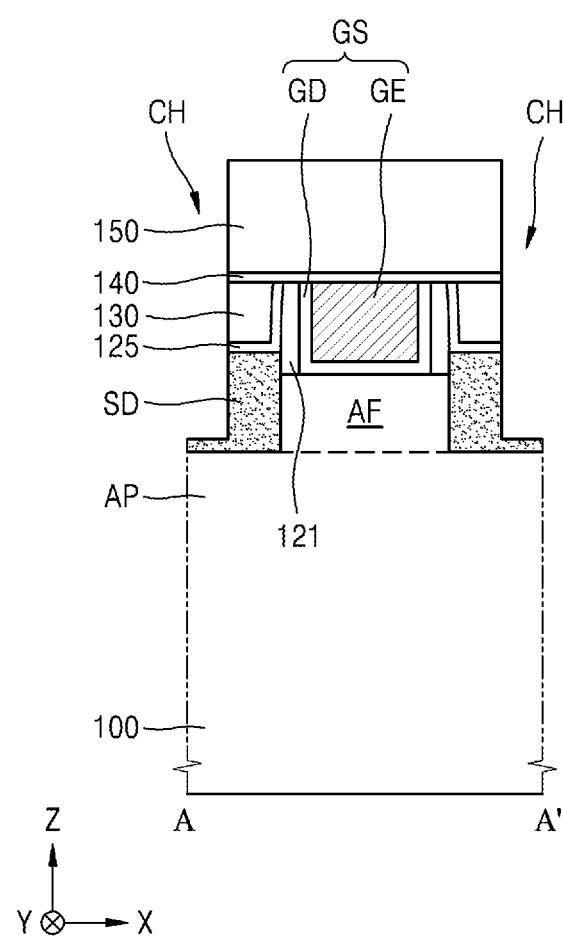
Figure 13B:
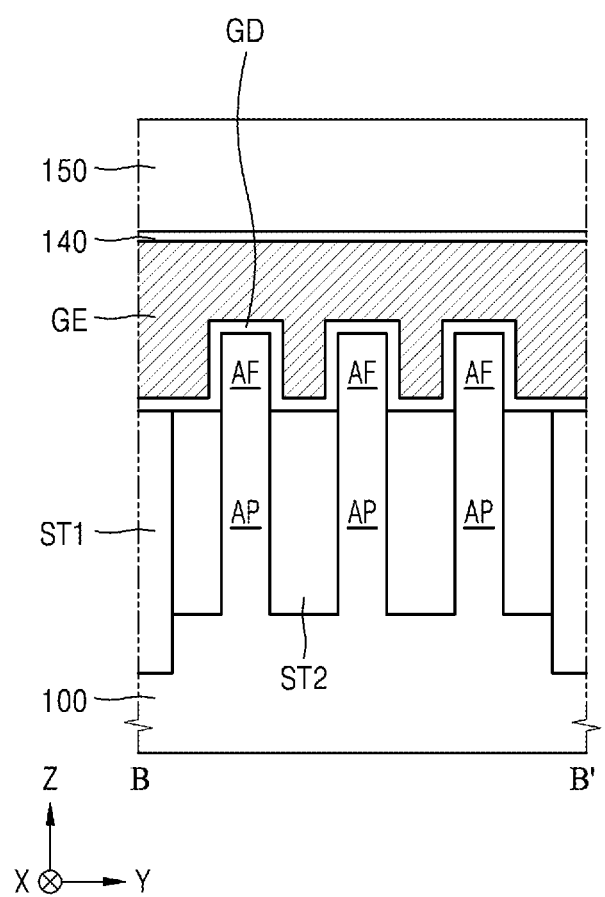
Figure 13C:
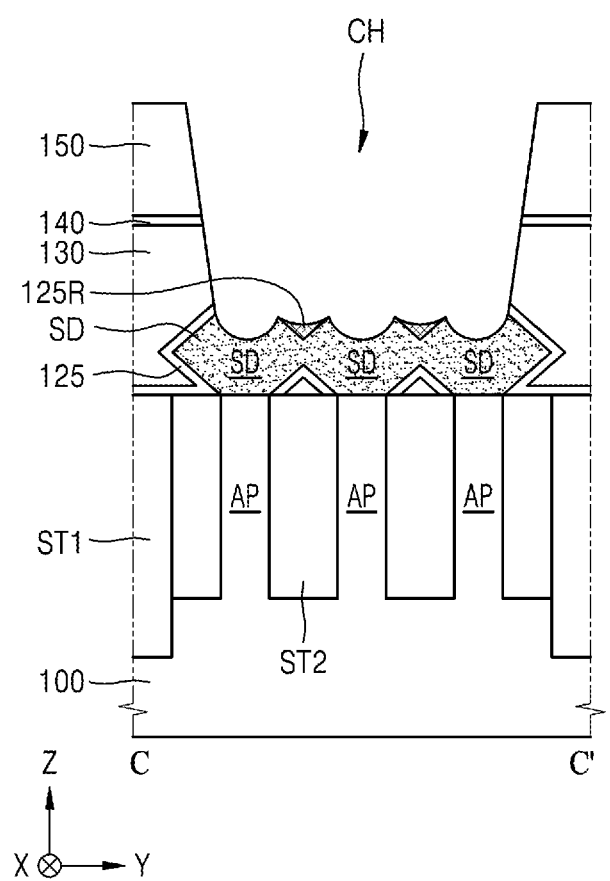

Referring to FIGS. 13A, 13B, and 13C, an etching process may be performed to partially remove the upper portions of the source/drain structures SD.

By removing pointy or pointed portions that are the upper portions of the source/drain structures SD by using the residual barriers 125R as etching masks, the upper surfaces of the source/drain structures SD may be recessed to be wave-shaped. That is, an overall height of the source/drain structures SD may be reduced.

Figure 14A:
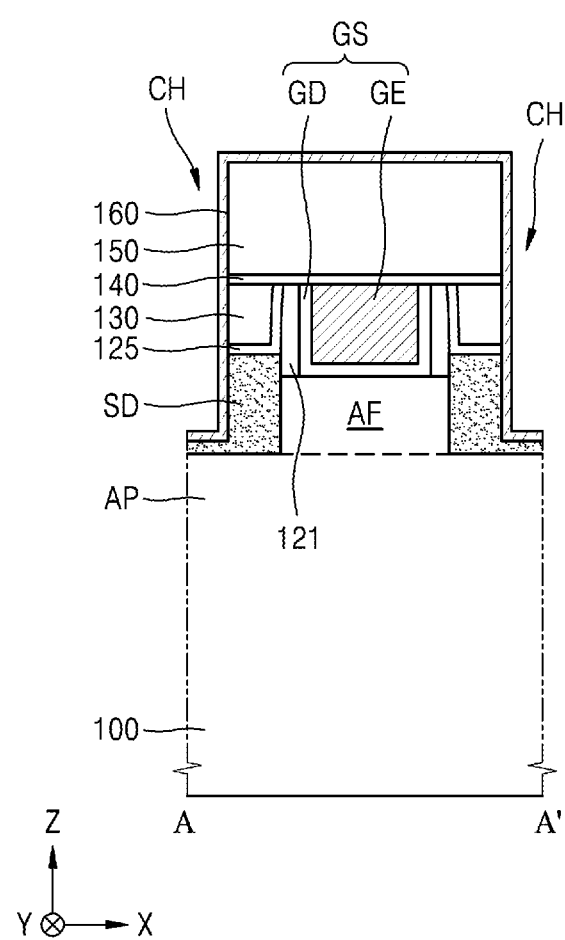
Figure 14B:
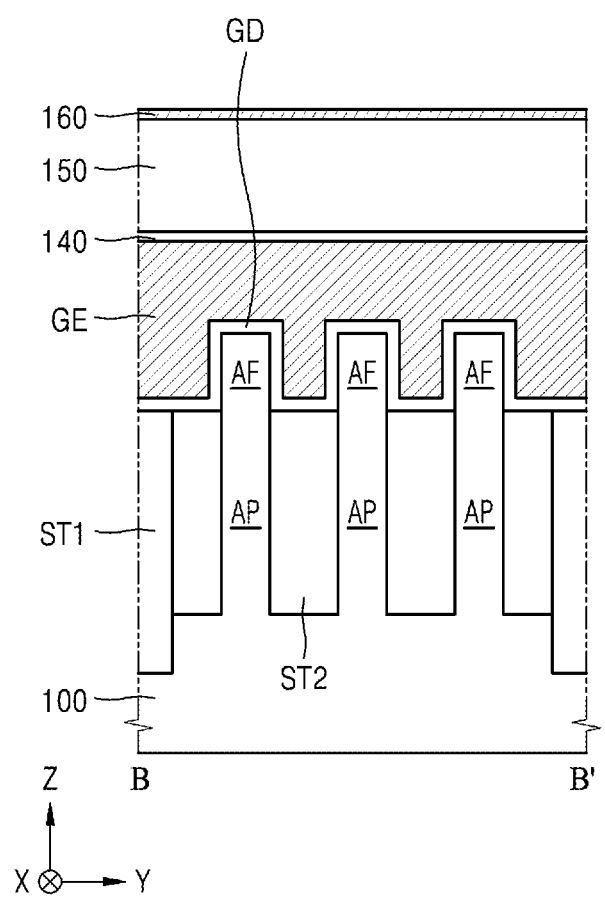
Figure 14C:
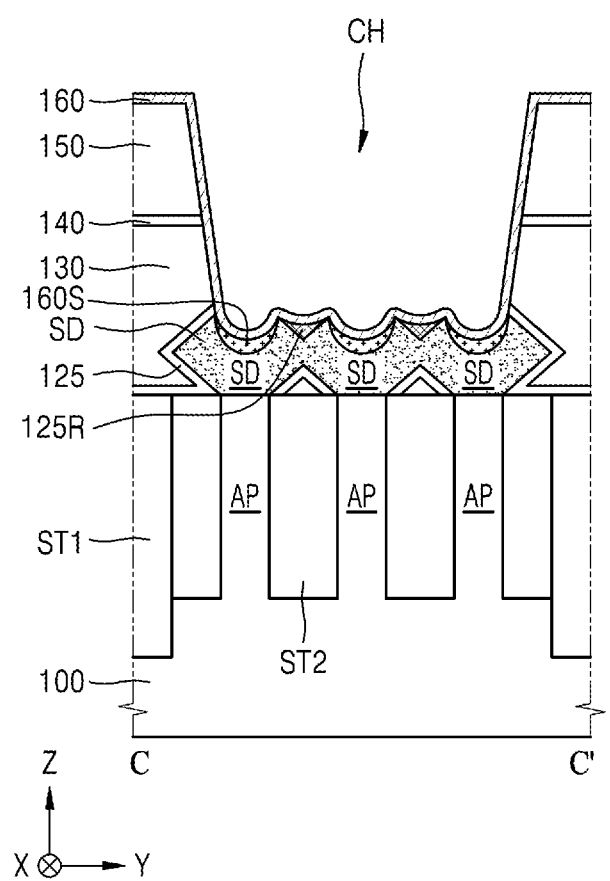

Referring to FIGS. 14A, 14B, and 14C, the barrier metal layer 160 may be conformally formed along the contact hole CH.

The barrier metal layer 160 may include at least one of, for example, titanium nitride and tantalum nitride. After forming the barrier metal layer 160, a heat treatment process is performed so that the silicide layer 160S may be formed between the barrier metal layer 160 and each of the source/drain structures SD.

Specifically, through the heat treatment process, a metal material included in the barrier metal layer 160 may react with Si of the source/drain structures SD so that the silicide layers 160S may be formed.

Therefore, the silicide layers 160S may include at least one of, for example, titanium-silicide and tantalum-silicide. In addition, the silicide layers 160S may be arranged on the upper portions of the source/drain structures SD to be apart from each other. That is, the silicide layers 160S and the residual barriers 125R may be alternately arranged in the second direction Y.

Figure 15A:
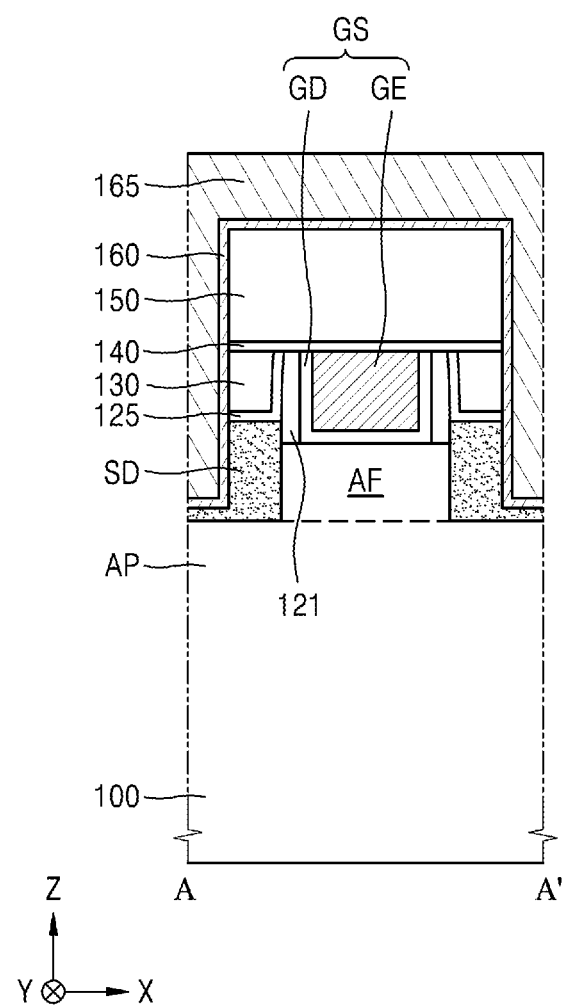
Figure 15B:
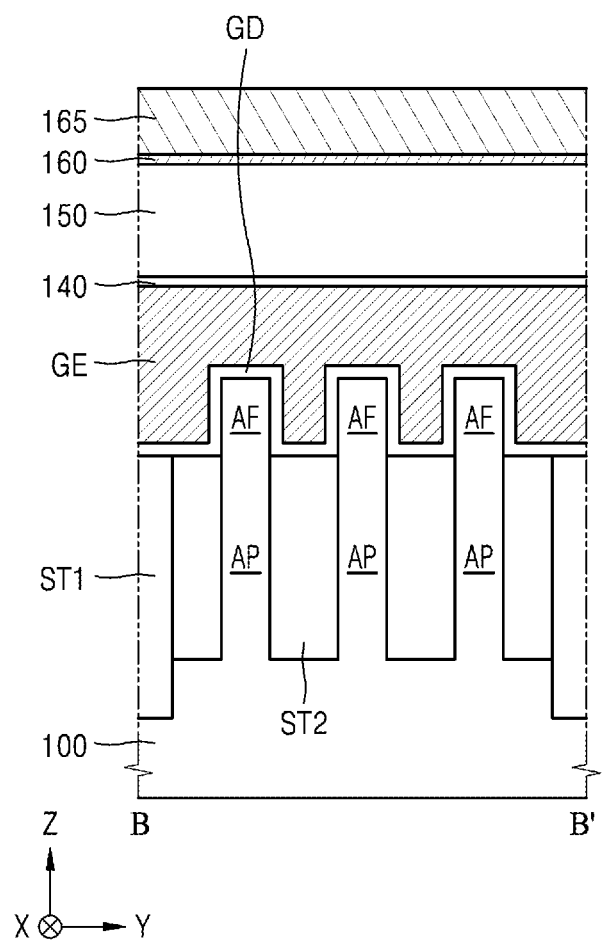
Figure 15C:
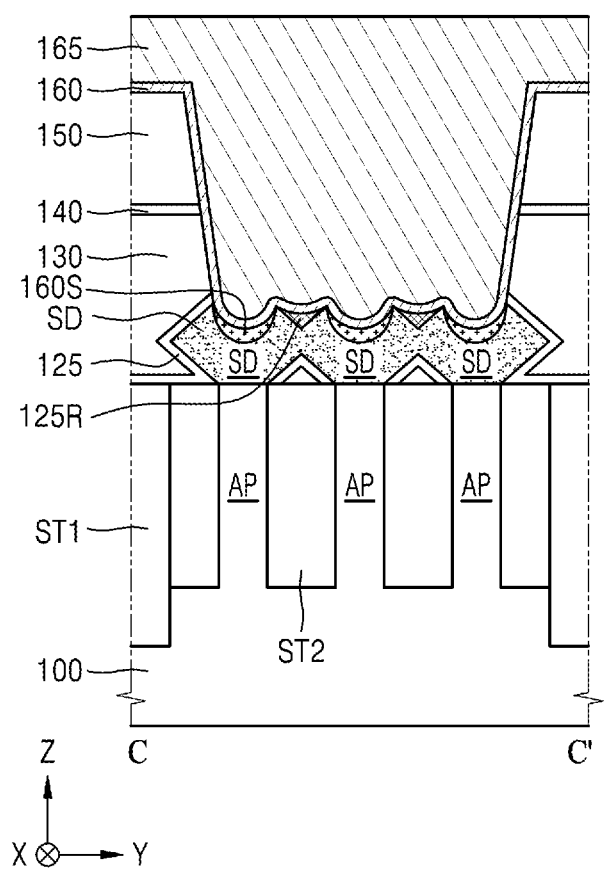

Referring to FIGS. 15A, 15B, and 15C, the contact metal layer 165 filling the contact hole CH (refer to FIG. 14C) may be formed.

The contact metal layer 165 may be formed on the barrier metal layer 160. The contact metal layer 165 may include at least one of, for example, W, Ti, and Ta. In some embodiments, the contact metal layer 165 may include a doped semiconductor material.

Referring to FIGS. 2A, 2B, and 2C again, by forming the contact structure CT by planarizing the contact metal layer 165 and the barrier metal layer 160 so that the upper surface of the second interlayer insulating layer 150 is exposed, the integrated circuit device 10 may be manufactured.

As described above, in methods of manufacturing the integrated circuit device according to the inventive concepts, the bottom surface of the contact structure CT may be wave-shaped, non-flat, and/or non-uniform, in comparison with the case in which the bottom surface of the contact structure CT is flat. Accordingly, a contact area between the source/drain structures SD and the contact structure CT may increase. Therefore, in the integrated circuit device 10, a more reliable electrical connection may be obtained and a contact resistance may be reduced.

Figure 16:
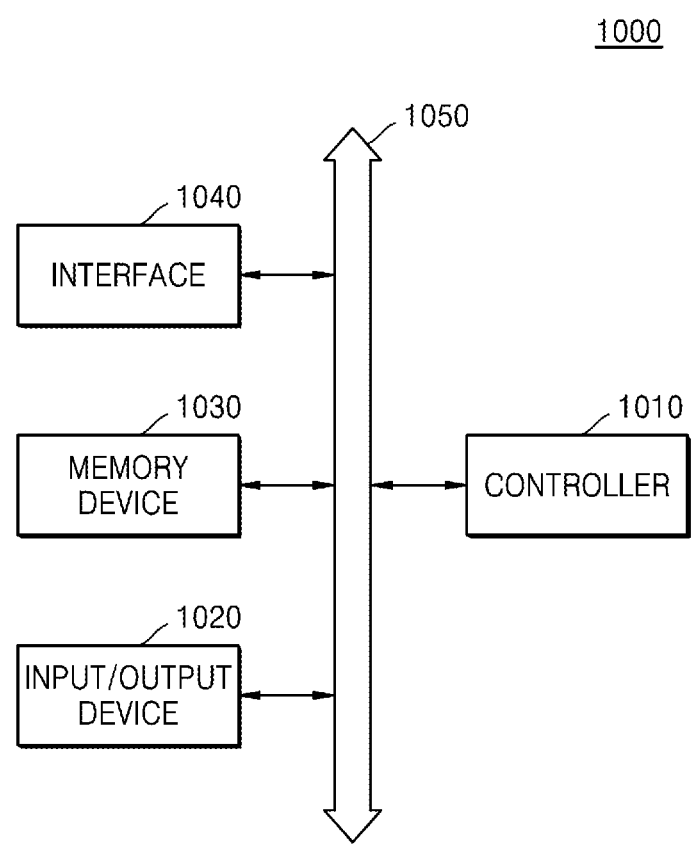
FIG. 16 is a block diagram illustrating a system including an integrated circuit device according to some embodiments of the inventive concepts.

FIG. 16 is a block diagram illustrating a system 1000 including an integrated circuit device according to some embodiments of the inventive concepts.

Referring to FIG. 16, the system 1000 includes a controller 1010, an input/output device 1020, a memory device 1030, an interface 1040, and a bus 1050.

The system 1000 may be a mobile system and/or a system configured for transmitting and/or receiving information. In some embodiments, the mobile system may be a portable computer, a tablet, a mobile phone, a digital music player, and/or a memory card.

The controller 1010 may be configured to control an execution program in the system 1000, and may include a microprocessor, a digital signal processor, a microcontroller, or a device similar to a microprocessor, a digital signal processor, or a microcontroller.

The input/output device 1020 may be configured to be used for inputting or outputting data of the system 1000. The system 1000 may be configured to be connected to an external device, for example, a personal computer (PC) or a network by using the input/output device 1020 and may exchange data with the external device when connected. The input/output device 1020 may be, for example, a touch pad, a keyboard, or a display.

The memory device 1030 may be configured to store data for an operation of the controller 1010 or data processed by the controller 1010. The memory device 1030 may include the above-described integrated circuit device 10 according to some embodiments of the inventive concepts.

The interface 1040 may be configured to provide a data transmission path between the system 1000 and the external device. The controller 1010, the input/output device 1020, the memory device 1030, and the interface 1040 may be configured to communicate with each other through the bus 1050.

While the inventive concepts have been particularly shown and described with reference to embodiments thereof, it will be understood that various changes in form and details may be made therein without departing from the scope of the following claims.

What is claimed is:

1. A method of manufacturing an integrated circuit device, the method comprising:
    forming a fin-type structure that extends in a first direction on a substrate and forming a channel area on the fin-type structure;
    forming a gate structure that extends on the substrate in a second direction and that crosses with the fin-type structure;
    forming a merged source/drain structure on a side of the gate structure;
    forming an etch stop layer on the merged source/drain structure;
    partially etching an upper surface of the merged source/drain structure to have a wavy shape by using a residual stop layer as an etch mask;
    forming a silicide layer on an etched portion of the merged source/drain structure; and
    forming a contact structure electrically connected to the merged source/drain structure and having a bottom surface that corresponds to the wavy shape of the upper surface of the merged source/drain structure.

2. The method of claim 1, wherein the silicide layer is formed under the contact structure at the etched portion of the merged source/drain structure, and wherein the residual stop layer is formed under the contact structure in a portion where the merged source/drain structure is not etched.

3. The method of claim 1, wherein a lowermost level of the silicide layer is lower than a lowermost level of the residual stop layer.

4. The method of claim 1, wherein a length of the silicide layer in the second direction is greater than a length of the residual stop layer in the second direction.

5. The method of claim 1, wherein the silicide layer and the residual stop layer are alternately formed in the second direction.

6. The method of claim 1, wherein the forming of the silicide layer comprises:

forming a barrier metal layer on the merged source/drain structure and the residual stop layer; and performing a heat treatment process.

7. The method of claim 6, wherein the barrier metal layer comprises a material that reacts with a material of the merged source/drain structure as a result of the heat treatment process.

8. The method of claim 6, wherein the forming of the contact structure comprises forming a contact metal layer on the barrier metal layer.

9. The method of claim 1, wherein a phase of the upper surface of the merged source/drain structure is substantially identical to a phase of a lower surface of the contact structure.

10. The method of claim 1, wherein the fin-type structure and the silicide layer are aligned in a vertical direction.

11. A method of manufacturing an integrated circuit device, the method comprising:

forming a plurality of fin-type structures and a plurality of channel areas that protrude from a substrate;

forming a gate structure crossing the plurality of fin-type structures;

forming a merged source/drain structure having a wavy upper surface on a first side of the gate structure;

alternately forming a silicide layer and a residual stop layer on the merged source/drain structure along the wavy upper surface; and forming a contact structure electrically connected to the merged source/drain structure.

12. The method of claim 11, wherein a number of the fin-type structures in contact with the merged source/drain structure is equal to a number of silicide layers arranged on the merged source/drain structure.

13. The method of claim 12, wherein a lower surface of the contact structure is formed along the wavy upper surface, and wherein a lowest point of the lower surface of the contact structure is formed on an upper portion of the fin-type structure.

14. The method of claim 11, wherein the forming of the contact structure comprises:

forming a barrier metal layer on the merged source/drain structure and the residual stop layer; and forming a contact metal layer on the barrier metal layer.

15. The method of claim 14, wherein the residual stop layer, the barrier metal layer, and the contact metal layer are sequentially formed in a vertical direction along the upper surface of the merged source/drain structure.

16. A method of manufacturing an integrated circuit device, the method comprising:

forming a plurality of fin-type structures and a plurality of channel areas extending in a first direction on a substrate;

forming a gate structure extending on the substrate in a second direction intersecting with the fin-type structures;

forming a merged source/drain structure on a first side of the gate structure and arranged on the plurality of fin-type structures;

forming an etch stop layer covering the merged source/drain structure;

forming an interlayer insulating layer that covers the etch stop layer;

forming a contact hole that extends into the interlayer insulating layer;

forming a residual stop layer by partially etching the etch stop layer;

partially etching an upper surface of the merged source/drain structure to have a wavy shape by using the residual stop layer as an etch mask;

forming a barrier metal layer along the contact hole and performing heat treatment to form a silicide layer under the barrier metal layer; and forming a contact metal layer filling the contact hole.

17. The method of claim 16, wherein the barrier metal layer is formed along the wavy shape of the merged source/drain structure and an upper surface of the residual stop layer.

18. The method of claim 16, wherein the barrier metal layer includes titanium, and wherein the contact metal layer includes tungsten.

19. The method of claim 18, wherein the silicide layer is formed of a combination of a material included in the barrier metal layer and a material included in the merged source/drain structure.

20. The method of claim 16, wherein the residual stop layer includes silicon nitride or silicon oxynitride.

* * * * *